United States Patent [19]

Yahagi et al.

[11] Patent Number: 6,094,634
[45] Date of Patent: Jul. 25, 2000

[54] DATA COMPRESSING APPARATUS, DATA DECOMPRESSING APPARATUS, DATA COMPRESSING METHOD, DATA DECOMPRESSING METHOD, AND PROGRAM RECORDING MEDIUM

[75] Inventors: Hironori Yahagi; Takashi Morihara, both of Kawasaki, Japan

[73] Assignee: Fujitsu Limited, Kawasaki, Japan

[21] Appl. No.: 09/012,548

[22] Filed: Jan. 23, 1998

[30] Foreign Application Priority Data

Mar. 26, 1997 [JP] Japan ................................... 9-073959

[51] Int. Cl.[7] ............................ G10L 13/08; H03M 7/30
[52] U.S. Cl. .............................. 704/260; 704/503; 341/90
[58] Field of Search .................................... 704/201, 235, 704/260, 500, 503, 8, 2, 7; 341/50, 51, 90

[56] References Cited

U.S. PATENT DOCUMENTS

| | | | |
|---|---|---|---|
| 4,692,941 | 9/1987 | Jacks et al. | 704/260 |
| 4,777,600 | 10/1988 | Saito et al. | 704/235 |
| 4,833,718 | 5/1989 | Sprague | 704/229 |
| 5,220,639 | 6/1993 | Lee | 704/200 |
| 5,357,546 | 10/1994 | Meriwether et al. | 704/201 |
| 5,717,827 | 2/1998 | Narayan | 704/260 |
| 5,787,230 | 7/1998 | Lee | 704/235 |
| 5,889,481 | 3/1999 | Okada | 704/8 |

OTHER PUBLICATIONS

Murashita et al., "High–speed statistical compression using self–organized rules and predetermined code tables," Proceedings Data Compression Conference, p. 449, Apr. 1996.

Picone et al., "Kanji–to–Hiragana conversion based on a length–constrained n–gram analysis," IEEE Transactions on Speech and Audio Processing, vol. 7, Issue 6, pp. 685–696, Nov. 1999.

Yoshida et al., "Application of a word–based text compression method to Japanese and Chinese texts," Data Compression Conference Proceedings, p. 561, Mar. 1999.

Morihara et al., "Japanse text compression using word–based coding," Data Compression Conference Proceedings, p. 564, Apr. 1998.

Nakano et al., "Highly efficient universal coding with classifying to subdictionaries for text compression," Data Compression Conference Proceedings, pp. 234–243, Mar. 1994.

Okada et al., "Self–organized dynamic Huffman coding without frequency counts," Data Compression Conference Proceedings, p. 473, Mar. 1995.

*Primary Examiner*—David R. Hudspeth
*Assistant Examiner*—Martin Lerner
*Attorney, Agent, or Firm*—Staas & Halsey LLP

[57] ABSTRACT

A data compressing/decompressing apparatus is suitable for compressing data containing plural-byte characters, for instance, a Japanese language text. The data compressing/decompressing apparatus owns a homonym dictionary in which KANJI-character idioms, KANJI-character-reading, and homonym discrimination information are stored in correspondence with each other. This data compressing/decompressing apparatus converts a KANJI-character idiom contained in declarative sentence data into phonetic data, and further compresses this phonetic data to output the compressed phonetic data. The phonetic data is such data that this KANJI-character idiom is replaced by information constituted by character number discrimination information indicative of the character number about KANJI-character idiom reading, the reading thereof, and the homonym discrimination information thereof.

36 Claims, 23 Drawing Sheets

FIG. 2

| READING | HOMONYM DISCRIMINATING INFORMATION | KANJI-CHARACTER |
|---|---|---|
| はんどう | 0 | 半導 |
|  | 1 | 反動 |
| せいひん | 0 | 製品 |
|  | 1 | 正賓 |
|  | 2 | 清貧 |
| こうちょう | 0 | 候鳥 |
|  | 1 | 黄鳥 |
|  | 2 | 好調 |
|  | 3 | 硬調 |
|  | 4 | 高調 |
|  | 5 | 高潮 |
|  | 6 | 紅潮 |
|  | 7 | 校長 |

[L] CHARACTER NUMBER DISCRIMINATION INFORMATION
[H] HOMONYM DISCRIMINATION INFORMATION
[EP] END POSITION DISCRIMINATION INFORMATION
[HS] HALF-SIZED KATAKANA-CHARACTER STARTING POSITION DISCRIMINATION INFORMATION
[FS] FULL-SIZED KATAKANA-CHARACTER STARTING POSITION DISCRIMINATION INFORMATION

FIG. 11

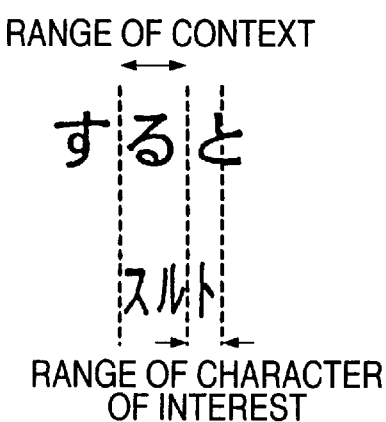

CONVENTIONAL APPARATUS (2-BYTE/1 CHARACTER)

PRESENT INVENTIVE APPARATUS (2-BYTE/1 CHARACTER)

RANGE OF CONTEXT

RANGE OF CHARACTER OF INTEREST

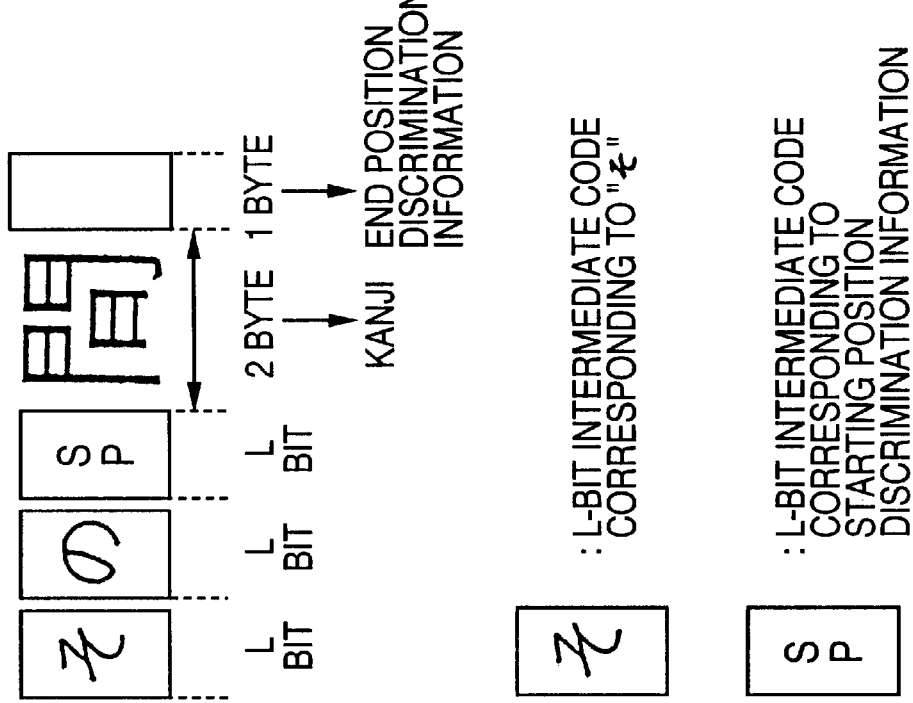
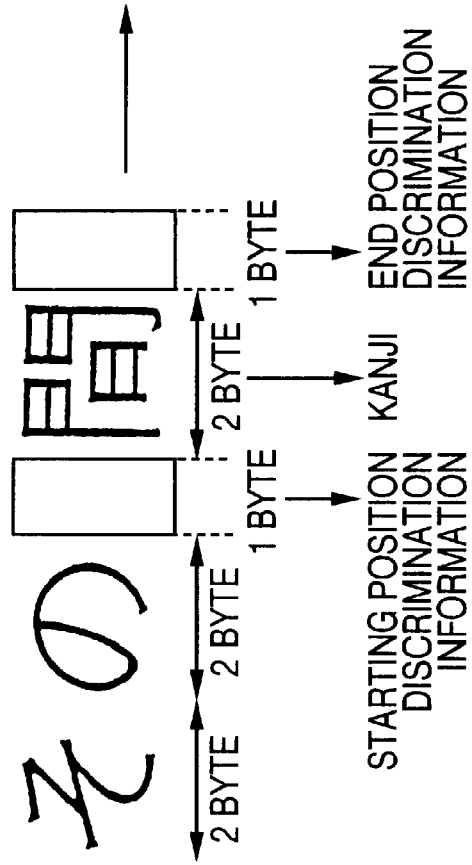
FIG. 19

| CHARACTER | OCCURRENCE PROBABILITY | RANGE |
|---|---|---|
| a | 0.20 | [ 0.0.2) |
| b | 0.10 | [ 0.2.0.3) |
| c | 0.05 | [ 0.3.0.35) |
| d | 0.15 | [0.35.0.5) |
| e | 0.50 | [ 0.5.1) |

DATA COMPRESSING APPARATUS, DATA DECOMPRESSING APPARATUS, DATA COMPRESSING METHOD, DATA DECOMPRESSING METHOD, AND PROGRAM RECORDING MEDIUM

BACKGROUND OF THE INVENTION

1. Field of the Invention

The present invention generally relates to apparatus and methods for compressing/decompressing text data containing characters expressed by a plurality of bytes, and also to a program recording medium. More specifically, the present invention is directed to apparatus/methods capable of compressing/decompressing Japanese text data, and also to a program recording medium.

2. Description of the Related Art

Very recently, amounts of electronic texts processed or saved by personal computers have considerably increased in connection with prevalence of electronic mail and the like. For instance, there are many users who can handle hundreds to one thousand of electronic mails per day. It is not rare that text data more than hundreds Mega bytes are saved within a year.

Under such circumstances, the data transmission time may be shortened, and also the data storage capacity may be reduced by compressing amounts of data by removing redundant information. Various data compressing methods have been proposed and utilized. So far, there are some compression methods available compressing various types of data, ranging over character codes, vector information, and images. In these compressing methods, a so-called "universal coding" method is used.

Now, several coding methods classified into the "universal coding" method will be simply explained. It should be noted in the following description that a single unit of data is expressed as a "character", and a plurality of "characters" connected to each other are expressed as a "string" following the names used in information theory.

First, arithmetic coding method will now be summarized. There are two types of arithmetic codings, that is, binary arithmetic coding, and multi-valued arithmetic coding dealing with values higher than three. In multi-valued arithmetic coding, the number line 0 or more, and less than 1 (will be expressed as [0, 1) hereinafter) are sequentially narrowed in accordance with the occurrence probability (occurrence frequency) of each of characters which construct the data to be coded. Then, when the process for all the characters is completed, the numeral value indicating the one point in the narrowed range is outputted as the code.

For example, in the case that five characters to be coded are a, b, c, d, e, and the occurrence probabilities of these five characters are 0.2, 0.1, 0.05, 0.15, 0.5, respectively. To each character, a range is allocated, whose width corresponds to the occurrence probabilities thereof (see FIG. 24).

Then, in the case that a string to be coded is "abe", as schematically illustrated in FIG. 25, first, a range [0, 1) is narrowed to another range [0, 0.2) with respect to the character "a". Subsequently, this range [0, 0.2) is subdivided into ranges, depending upon the occurrence probabilities of the respective characters, and a range [0.04, 0.06) calculated based on the range of "b" is selected as a range for another string "lab". Furthermore, this range [0.04, 0.06) is subdivided into ranges in response to the occurrence probabilities of the respective characters, and then another range [0.05, 0.06) calculated based on the range of the next character "e" is selected as the range for the string "abe". Thereafter, the bit string less than the decimal point when a position of an arbitrary point (for instance, a lower limit point) within this final range is expressed by the binary number is outputted as the coded result.

It should be noted that arithmetic coding method is further classified into the static coding system, the semi-adaptive coding system, and the adaptive coding system, depending upon the methods for subdividing the range in response to the occurrence probabilities (occurrence frequencies). In the static coding system, the range is subdivided in accordance with the preset occurrence frequencies irrelevant to the actual occurrence frequencies of the respective characters. In the semi-adaptive coding system, the range is subdivided based on the occurrence frequency obtained by scanning the overall characters in the beginning. In the adaptive coding system, the occurrence frequency is again calculated every time the character appears to thereby again set the range. This arithmetic coding system is described in, for instance, "Text Compression" written by Bell, T. C., Cleary, J. G., and Witten, I. H. (1990), published by Prentice-Hall, Inc.

On the other hand, another universal coding method called as a "splay coding method" is also known in this technical field. In the splay coding method, a process for rearranging the code tree (namely, code table with tree structure) is carried out so that a shorter code can be allocated to a character which has higher occurrence frequency, every time a character is coded. The splay coding method is described more in detail, for example, in "Application of Splay Trees Data Compression" written by Jones, Douglas W., Commun. ACM, vol. 31, No. 8 pages 996 to 1007, August in 1988.

Also, another coding method, called blending splay coding method is known. The blending splay coding method is such that a statistical model called the blending model is adopted in the splay coding method.

In the blending splay coding method, a code tree is prepared with respect to each context. As schematically illustrated in FIG. 26, a context is equal to a string ("ab") existing immediately before a character to be coded ("c"). In the blending splay coding method (blending model), the number of characters used as a context order is controlled in response to the appearing degrees of the context in a context tree shown in FIG. 27. In general, that is to say, when data with strong correlation between the characters is coded, the higher the order of the used context is, the higher the compression rate can be. On the other hand, when the data with weak correlation between the characters is coded, using the higher order context, sometimes declines the compression ratio, instead of improving. In order to avoid this problem, the blending model technique has been developed. In the blending model, the orders of the respective contexts are changed in correspondence with the input data in such a manner that when a certain context easily appears, the order of this context is increased, whereas when another context does not easily appear, its order remains low.

Since the above-described respective coding methods were developed in cultural areas using the alphabet, 1 byte is handled as one character when the data is compressed by using the respective coding methods. As a result, there is a problem that when a sentence containing characters expressed by 2 bytes, e.g. Japanese language, is compressed using the respective techniques, not so higher compression rate can be achieved, as compared with English text.

In other words, in a 2-byte character, only a combination of 2-byte data make sense, and there is no correlation between each byte, constituting a 2-byte character. As a consequence, the conventional compression method which processes the 2-byte character in a unit of 1-byte, cannot attain higher compression ratio, because, in view of information theory, it compresses the data after reducing the information source (2-byte data is subdivided into 1 byte).

There is another problem such that it is difficult to achieve the high compression rate by using the context. In other words, since there are thousand sorts of chinese-characters that are used in an ordinary text, when the texts, substantially, with the same size are compressed using the same order of contexts, a large number of contexts appearing Japanese text, as compared with English text. Actually, total numbers of 4-byte contexts are given as follows, when both an 8 KB-Japanese text and an 8 KB-English one were compressed. Approximately 3,000 sorts of contexts appeared in the latter, and approximately 5,000 sorts of contexts appeared in the former. Also, there is a possibility that Japanese texts, to be compressed, have relatively small capacities (approximately, several A-4 sized sheets) such as electronic mails. As a result, when a Japanese text is compressed, the process is sometimes over, before the sufficient statistical information related to the respective contexts is gathered. This may cause lowering of the compression ratio of the Japanese text.

SUMMARY OF THE INVENTION

Therefore, an object of the present invention is to provide a data compressing apparatus, a data compressing method, and a program recording medium, which are suitable to compress text data of a language whose, character is expressed by a plurality of bytes such as Japanese.

Another object of the present invention is to provide a data decompressing apparatus, a data decompressing method, and a program recording medium, which can decompress the data compressed by the above-described data compressing apparatus/method.

In a data compressing apparatus according to a first aspect of the present invention, phonetic text data is produced by a phonetic text data producing unit. This phonetic text data is equal to such data that each of the character information contained in the original text data to be compressed is replaced by phonetic character information indicative of a sound produced when a character corresponding to this character code is pronounced. Then, the phonetic text data formed by the phonetic text data producing unit is compressed by a compressing unit.

As previously described, in the data compressing apparatus according to the first aspect, the original text data is converted into the phonetic text data expressed by such phonetic character information having the smaller sort than that of the original text data, and thereafter is compressed. As a consequence, if this data compressing apparatus is employed, then the data compression at higher compression rate can be realized, as compared with the conventional data compressing apparatus for directly compressing the original text data.

It should be noted that when the data compressed by this data compressing apparatus is decompressed, such a data decompressing apparatus is employed which is comprised of: a decompressing unit for decompressing compression text data; and an original text data producing unit for producing original text data corresponding to the compression text data by converting phonetic character information restored by the decompressing unit, into character information corresponding thereto.

A data compressing apparatus according to a second aspect of the present invention is comprised of a phonetic character information storing unit, a retrieving/reading unit, a phonetic text data producing unit, an intermediate code text table forming unit, and a compressing unit.

In the phonetic character information storing unit, phonetic character information equal to information indicative of a sound, produced when a word composed of a plurality of character information to be converted is pronounced, is stored, to the plurality of word information to be converted being constructed of one or plural character information. The retrieving/reading unit retrieves the word information to be converted stored into the phonetic character information storing unit from the original text data, and then reads phonetic character information corresponding to the retrieved word information to be converted from the phonetic character information storing unit.

The phonetic text data producing unit produces phonetic text data by replacing the word information to be converted within the original text data retrieved by the retrieving/reading unit, by word replacement information to be converted, which contains the phonetic character information read by the retrieving/reading unit. The intermediate code table forming unit forms an intermediate code table used to adapt an intermediate code to an information element utilized in the phonetic text data produced by the phonetic text data producing unit. The intermediate code text data producing unit produces intermediate code text data by converting the respective information elements for constructing the phonetic text data into the corresponding intermediate codes by using the intermediate code table produced by the intermediate code table forming unit. The compressing unit compresses the intermediate code text data produced by the intermediate code text data producing unit.

That is to say, in the data compressing apparatus of the second aspect of the present invention, the word to be converted within the original text data is firstly replaced by the phonetic character information, so that it is possible to produce the phonetic text data in which the sort of the used characters is smaller than that of the original text data. Thereafter, the new code (intermediate code) is allocated to each of the information elements (characters) contained in the phonetic text data, and then the phonetic text data is converted into the intermediate code text data by employing this intermediate code. Then, this intermediate code data is compressed. As a consequence, in accordance with this data compressing apparatus, text data such as characters that include symbols, which can be hardly represented by the phonetic character information, may be compressed in higher compression ratio.

A data decompressing apparatus for decompressing the data compressed by this data compressing apparatus of the second aspect is comprised of a phonetic character information storing unit, a decompressing unit, a phonetic text data producing unit, and an original text data producing unit. In the phonetic character information storing unit, there is stored phonetic character information equal to information indicative of a sound produced when a word indicated by a plurality of word information to be converted is pronounced, to the word information to be converted being constructed of one or plural character information. The decompressing unit decompresses compression text data to output intermediate code text data. The phonetic text data producing unit produces phonetic text data by replacing each of intermediate codes contained in the intermediate code text data outputted by the decompressing unit by information adapted to the intermediate code in an intermediate code table related to the compression text data.

The original text data producing unit produces original text data equal to an original of the compression text data in such a manner as word replacement information to be converted is retrieved which is contained in the phonetic text data produced by the phonetic text data producing unit, and the retrieved word replacement information to be converted is replaced by word information to be converted which is stored in the phonetic character information storing unit in correspondence with the phonetic character information contained in the word replacement information to be converted.

When the data compressing apparatus of the second aspect is formed, as the intermediate code table forming unit, it is possible to employ such a unit for forming an intermediate code table for allocating an intermediate code having a minimum bit number to each of the information elements used in the phonetic text data, and the minimum bit number is capable of expressing these information elements.

Also, as the phonetic text data producing unit, it is possible to employ such a unit for producing the phonetic text data by replacing a preselected sort of character information by replacement information sandwiched between starting position discrimination information and end position discrimination information, which indicate that the character information is equal to the preselected sort of character information. In this case, as the intermediate code table forming unit, it is possible to employ such a unit for forming an intermediate code table as the intermediate codes do not correspond to both information subsequent to the starting position discrimination information and the end position discrimination information within the phonetic text data, and as the intermediate code data producing unit, it is possible to use a unit which does not convert the information subsequent to the starting position discrimination information and the end position discrimination information within the phonetic text data into the intermediate codes.

When the data compressing apparatus is arranged in this manner, for instance, a predetermined sort of character information such as a Chinese-style-reading 1 KANJI-character is not converted into the phonetic character information, and not converted into the intermediate code.

Also, as the intermediate code table forming unit, it is possible to employ such a unit which selects "N-1" pieces of information elements when a sort of information elements used in the phonetic text data exceeds a number "N" of information capable of being expressed by a predetermined bit number to thereby allocate intermediate codes among the information elements used in the phonetic text data; and also forms an intermediate code table by which the predetermined bit number of intermediate codes, whose contents are different from each other, are related to the selected "N-1" pieces of information elements and also to the starting position discrimination information. In this case, as the intermediate code data producing unit, it is possible to employ a unit which produces the intermediate code text data in such a manner as with regard to information contained within the phonetic text data, to which the intermediate code is related by the intermediate code table, this information is converted to the corresponding intermediate code, and with regard to unallocated information equal to such information to which no intermediate code is allocated, the unallocated information is replaced by such unallocated replacement information, and to have the unallocated information which is also capable of recognizing an end position as to have an intermediate code related to the starting position discrimination information.

Also, it is possible to employ such a phonetic character information storing unit as to store both the phonetic character information and the homonym discrimination information which discriminates between the words to be converted to the same phonetic character information. In this case, the retrieving/reading unit is arranged in such a way as this retrieving/reading unit reads out the phonetic character information and the homonym discrimination information, which correspond to the retrieved words to be converted. Also, the phonetic text data producing unit is arranged in such a way as it replaces the word information to be converted within the original text data by word replacement information to be converted which contains both the phonetic character information and the homonym discrimination information read by the retrieving/reading unit. Further, the intermediate code table forming unit is arranged so that it can form the intermediate code table directed to the information elements except for the homonym discrimination information.

A data compressing apparatus according to the third aspect of the present invention is comprised of a phonetic character information storing unit, a retrieving/reading unit, and a phonetic text data producing unit.

In the phonetic character information storing unit, phonetic character information equal to a sound, produced when one or plural-character word indicated by word information to be converted is pronounced, is stored. The retrieving/reading unit retrieves the word information to be converted stored in the phonetic character information storing unit from the original text data, and then reads phonetic character information corresponding to the retrieved word information to be converted from the phonetic character information storing unit. The phonetic text data producing unit produces phonetic text data by replacing the word information to be converted within the original text data retrieved by the retrieving/reading unit by word replacement information to be converted, which contains the phonetic character information read by the retrieving/reading unit. The compressing unit compresses the phonetic text data produced by the phonetic text data producing unit.

According to the data compressing apparatus of this third aspect, the original text data is converted into the phonetic text data expressed by such phonetic character information having the smaller sort than that of the original text data. As a result, the data compression in high compression ratio can be realized, as compared with such a case as the original text data is directly compressed.

When the data compressed by the data compressing apparatus according to the third aspect of the invention is decompressed, such a data decompressing apparatus is employed as is comprised of a phonetic character information storing unit, a decompressing unit, and an original text data producing unit. In the phonetic character information storing unit, phonetic characteristic information equal to a sound produced when one or plural character word indicated by word information to be converted is pronounced is stored. The decompressing unit decompresses compression text data to output phonetic character information data. The original text data producing unit produces original text data equal to an original of the compression text data in such a way as word replacement information to be converted is retrieved which is contained in the phonetic text data produced by the decompressing unit, and the retrieved word replacement information to be converted is replaced by word information to be converted which is stored in the phonetic character information storing unit in correspondence with the phonetic character information in the word replacement information to be converted.

In the data compressing apparatus according to the respective aspects of the present invention, any types of phonetic character information may be used. For instance, information indicative of alphabet, and information for representing a vowel and a consonant of the Hangul alphabet may be used. Also, other information indicative of the international phonetic symbol and the phonetic transcription systems for Chinese, that is, Pinyin, used in mainland China or Zhuyin zimu, used in Taiwan, may be employed.

BRIEF DESCRIPTION OF THE DRAWINGS

A more complete understanding of the teachings of the present invention may be acquired by referring to the accompanying figures, in which like reference numbers indicate like features and wherein;

FIG. 2 is an explanatory diagram for explaining a homonym dictionary employed in the data compressing/decompressing apparatus according to the first embodiment;

FIG. 10 is an explanatory diagram for explaining operation of the phonetic converting unit employed in the data compressing/decompressing apparatus according to the second embodiment;

FIG. 11 is an explanatory diagram for explaining the reason why the compression is carried out in high compressing rate by the data compressing/decompressing apparatus of the second embodiment;

FIG. 19 is an explanatory diagram for explaining operation of the intermediate code converting unit employed in the data compressing/decompressing apparatus according to the third embodiment;

DETAILED DESCRIPTION OF THE PREFERRED EMBODIMENTS

Referring now to drawings, various embodiments of the present invention will be described more in detail.

FIRST EMBODIMENT MODE

A data compressing/decompressing apparatus according to a first embodiment mode of the present invention is an apparatus for compressing/decompressing a Japanese language text, and this apparatus may be realized by operating a computer in accordance with a compressing/decompressing program.

Figure 1:
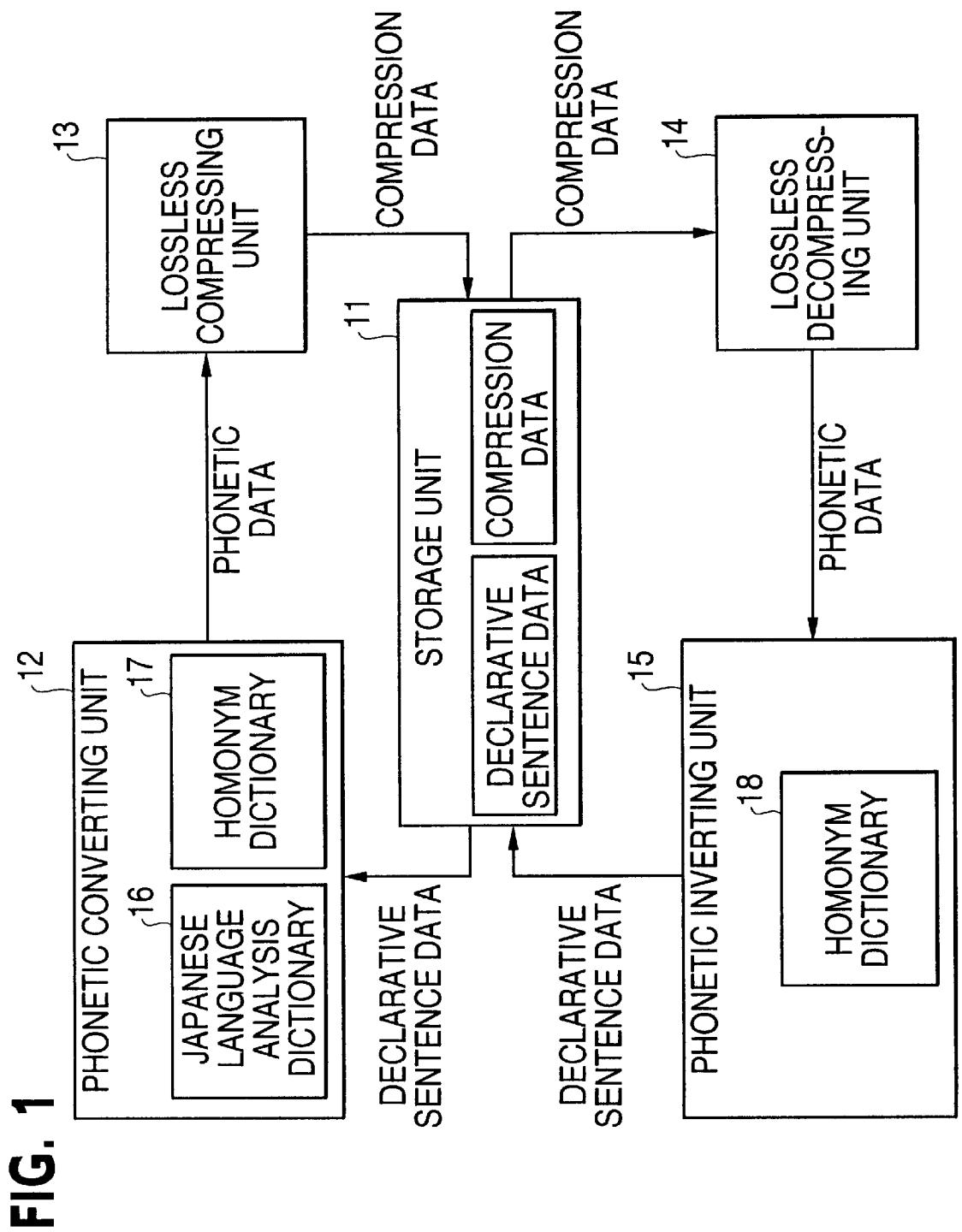
FIG. 1 is a functional block diagram for showing a data compressing/decompressing apparatus according to a first embodiment of the present invention.

First, the data compressing/decompressing apparatus according to the first embodiment will now be summarized with reference to a functional block diagram indicated in FIG. 1. As represented in this drawing, the data compressing/decompressing apparatus according to the first embodiment is equipped with a storage unit 11, a phonetic converting unit 12, a lossless compressing unit 13, a lossless decompressing unit 14, and a phonetic inverting unit 15.

The storage unit 11 stores declarative sentence (HEIBUN) data corresponding to data to be compressed (otherwise, decompressed data), and also compression data corresponding to a compression result of the declarative sentence data. It should be noted that data in which the shift JIS code is used is stored as the declarative sentence data into the storage unit 11.

Both the phonetic converting unit 12 and the lossless compressing unit 13 will function when data is compressed. The phonetic converting unit 12 contains a Japanese language analysis dictionary 16 and a homonym (homophone) dictionary 17. The Japanese language analysis dictionary 16 is such a dictionary as used to extract both a KANJI-character idiom and a KANJI-character (Chinese-style reading, Japanese-style reading) of a single word from declarative sentence data made of both KANJI-characters and a non-KANJI-character (HIRAGANA-character, KATAKANA-character, symbol). The homonym dictionary 17 is such a dictionary for storing homonym discrimination information equal to information used to specify one KANJI-character idiom (or KANJI-character) from reading (HIRAGANA-character string) of KANJI-character idioms (or KANJI-characters). In other words, as illustrated in FIG. 2, homonym discriminating information (0, 1, - - - ) having different contents is stored in the homonym dictionary 17 with reference to a plurality of KANJI-character idioms having the same reading. It should be noted in this first embodiment that 1-byte information where numeral values are expressed by the binary number is employed as the homonym discriminating information.

The phonetic converting unit 12 converts the declarative sentence data stored in the storage unit 11 by using the Japanese language analysis dictionary 16 and the homonym dictionary 17, and supplies the lossless compressing unit 13 with phonetic data corresponding to the conversion result. The phonetic converting unit 12 may convert declarative sentence data into phonetic data by replacing either a KANJI-character or a KANJI-character idiom contained in this declarative sentence data into information constructed of character number discrimination information, reading, and homonym discrimination information (will be explained later). This character number discrimination information indicates the character number of this reading (HIRAGANA-character string). The lossless compressing unit 13 executes information lossless compression operation with respect to phonetic data, and then stores the compression result (compression data) into the storage unit 11. In this first embodiment, as one example, the lossless compressing unit 13 executes the blending splay coding operation in which the maximum degree of the context is equal to "2".

The lossless decompressing unit 14 and the phonetic inverting unit 15 may function when data is decompressed. The lossless decompressing unit 14 owns a function capable of decompressing compression data outputted from the lossless compressing unit 13. The lossless decompressing unit 14 decompresses the compression data stored in the storage unit 11, and supplies the phonetic inverting unit 15 with the decompression result (phonetic data). The phonetic inverting unit 15 owns a homonym dictionary 18 the contents of which are equal to those of the homonym dictionary 17. The phonetic inverting unit 15 converts the phonetic data by using the dictionary thereof, and then stores the declarative sentence data corresponding to the conversion result into the storage unit 11.

The operations of the data compressing/decompressing apparatus according to the first embodiment will now be described more in detail. The operations when the data is compressed are first explained.

Figure 3:
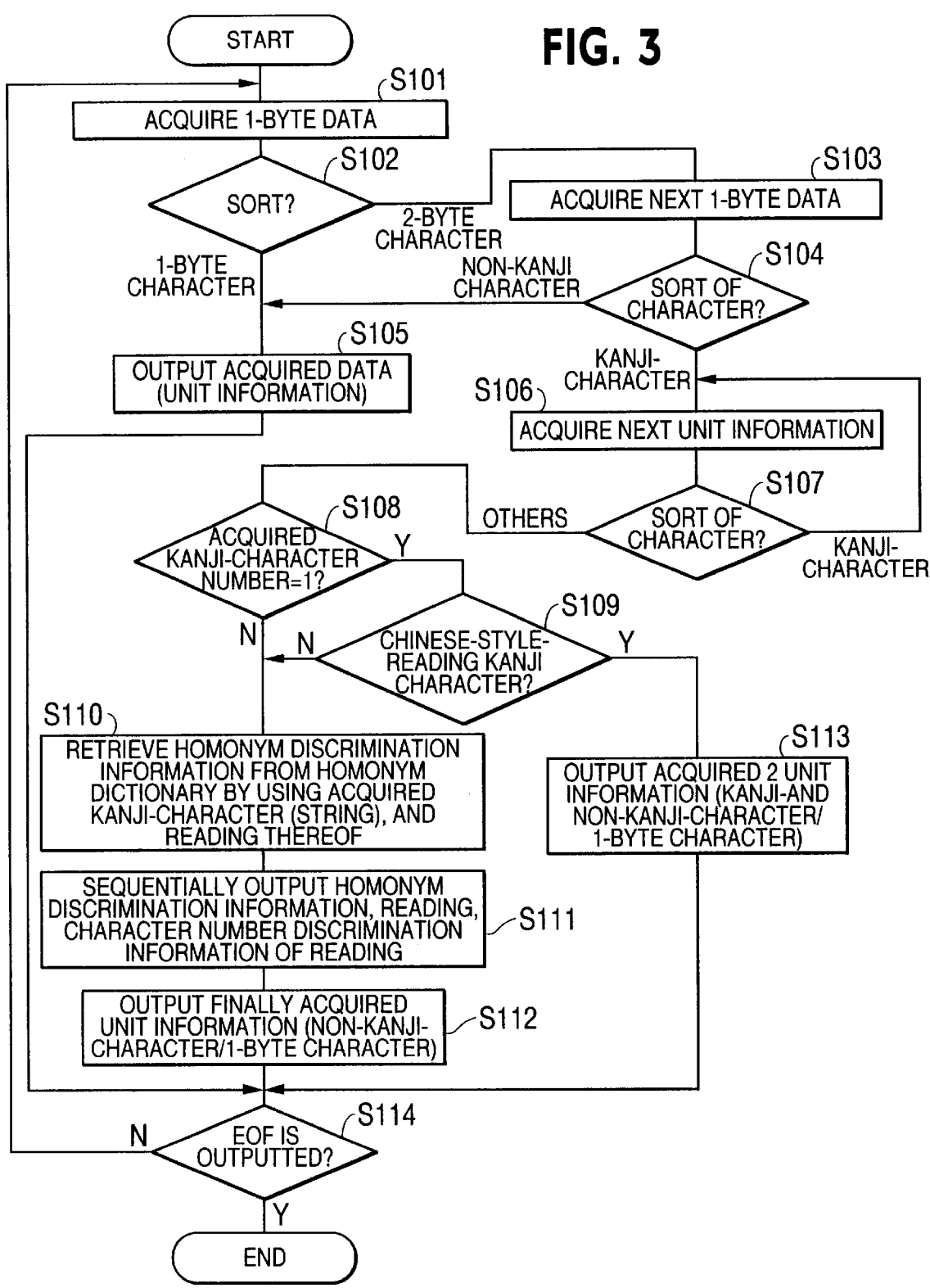
FIG. 3 is a flow chart for describing sequential operation of a phonetic converting unit employed in the data compressing/decompressing apparatus according to the first embodiment.

FIG. 3 represents sequential operation of the phonetic converting unit 12 when the data is compressed. As indicated in this flow chart of FIG. 3, during the data compression operation, the phonetic converting unit 12 first acquires 1-byte data from declarative sentence data, which is stored in the storage unit 11 and should be compressed (step S101). Then, a judgment is made as to whether this data corresponds to a 1-byte character (control code, alphabet, numeral, half-sized KATAKANA-character), or a first byte of a 2-byte character (step S102).

In the case that the acquired data corresponds to the first byte of the 2-byte character (step S102; 2-byte character), the phonetic converting unit 12 acquires subsequent 1-byte data from the declarative sentence data (step S103). Next, the phonetic converting unit 12 judges whether or not a character expressed by the acquired 2-byte data corresponds to a KANJI-character (step S104). In the case that this character is not equal to the KANJI-character (step S104; non-KANJI-character), namely this character corresponds to a HIRAGANA-character, a KATAKANA-character, and a symbol (horizontal rule element etc.), the phonetic converting unit 12 outputs the acquired data to the lossless compressing unit 13 (step S105). Also, in such a case that the data acquired at the step S101 is equal to the 1-byte character (step S102; 1-byte character), the phonetic converting unit 12 outputs the acquired data to the lossless compressing unit 14 (step S105). Then, when the outputted data is not equal to "EOF" (step S114; N), the process operation is returned to the step S101 at which the above-described process operation is carried out with respect to the remaining data contained in the declarative sentence data.

For the sake of simple explanation, both 1-byte data indicative of a 1-byte character and 2-byte data indicative of a 2-byte character are expressed as unit information.

In such a case as a character indicated by the unit information constructed of the acquired 2-byte data corresponds to a KANJI-character (step S104; KANJI-character), the phonetic converting unit 12 acquires next unit information from the declarative sentence data (step S106). That is, in the case that the next 1-byte data is acquired from the declarative sentence data and then this 1-byte data is equal to a 1-byte character, this data is recognized as "unit information". Also, when this 1-byte data is equal to a first byte of a 2-byte character, the phonetic converting unit 12 further acquires 1-byte data, and then recognizes these 2 byte data as "unit information".

Thereafter, the phonetic converting unit 12 judges whether newly acquired unit information expresses a KANJI-character, or a non-KANJI-character or a 1-byte character (step S107). When this newly acquired unit information indicates the KANJI-character (step S107; KANJI-character), the process operation is returned to the step S106 at which the phonetic converting unit 12 acquires next unit information from the declarative sentence data.

In such a case that the unit information newly acquired at the step S106 expresses either the non-KANJI-character or the 1-byte character (step S107; others), the phonetic converting unit 12 judges whether a total number of acquired KANJI-characters is equal to "1" (step S108). When the total number of acquired KANJI-characters is equal to "1" (step S108; Y), the phonetic converting unit 12 judges whether or not this KANJI-character is the Chinese-style-reading KANJI-character (step S109). It should be noted that the phonetic converting unit 12 executes the judgment defined at the step S109 by using the unit information (such as suffixed KANA) finally acquired in the loop by the steps S106 and S107.

When the acquired KANJI-character is 1 character and further is not equal to the Chinese-style-reading KANJI-character (step S109; N), and also when the acquired KANJI-characters are 2 or more characters (step S108; N), the phonetic converting unit 12 retrieves homonym discrimination information from the homonym dictionary 13 by using the acquired KANJI-character, or the acquired KANJI-character series, and the reading thereof (HIRAGANA-character series) (step S110). Next, the phonetic converting unit 12 outputs character number discrimination information corresponding to the number of read characters, the reading, and also the retrieved homonym discrimination information in this order into the lossless unit 14 (step S111). It should be noted that character number discrimination information corresponds to 1-byte data related to numeral values. To the character number discrimination information corresponding to the respective numeral values, codes other than 00-7F, A1-DF used in the 1-byte character, and 81-9F, E0-EF (hexadecimal notation) used in the first byte of the 2-byte character are allocated.

Figure 4:
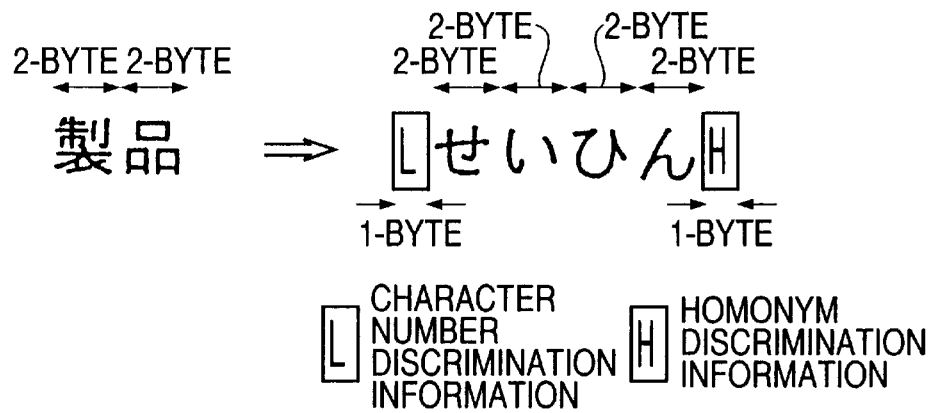
FIG. 4 is an explanatory diagram for explaining operation of the phonetic converting unit employed in the data compressing/decompressing apparatus according to the first embodiment.

For example, when the acquired KANJI-character series is 製品 which means "product", as illustratively shown in FIG. 4, the phonetic converting unit 12 outputs the 1-byte character number discrimination information indicative of a character number "4" of "せいひん" corresponding to the reading of "製品", data having 8 bytes in total and indicative of "せいひん", and the 1-byte homonym discrimination information (0×00, content of homonym discrimination dictionary 17 is shown in FIG. 3) at the step S111.

After outputting the homonym discrimination information, the phonetic converting unit 12 outputs the unit information finally acquired in the loop of the steps S106 and S107 to the lossless compressing unit 13 (step S112). Then, when the outputted unit information is not equal to "EOF" (step S114; N), the process operations from the step S101 is again executed.

In such a case that the acquired KANJI-character corresponds to 1 character of a Chinese-style-reading KANJI character (step S109; Y), the phonetic converting unit 12 outputs two pieces of the previously acquired unit information (KANJI-character, and non-KANJI-character, or 1-byte character) to the lossless compressing unit 13 (step S113), and then the process operation is advanced to a further step S114. The reason why another process operation is carried out with respect to the Chinese-style-reading KANJI-character of 1 character is given as follows: That is, a large quantity of homonyms are present in Chinese-style-reading KANJI-characters. There are certain possibilities that such homonyms are present as cannot be expressed by 1 byte (see "SHIN MEIKAI KANWA JITEN" issued by SANSEIDO publisher, volume 3, 1987; 362 words are listed up as homonym of "こう"). Under such a circumstance, when 1 character of Chinese-style-reading is processed in a similar manner to other KANJI-characters, there are many sorts of homonym discrimination information. As a result, conversion into the reading thereof become less significant.

When the phonetic converting unit 12 repeats such a process operation and thus outputs "EOF" (step S114; Y), the process operation for the declarative sentence data to be compressed is complete.

Figure 5:
FIG. 5 is an explanatory diagram for explaining operation of the phonetic converting unit employed in the data compressing/decompressing apparatus according to the first embodiment.

Although not shown in the flow chart, it should be understood that when the process operation is actually branched to the "NO" side at the step S108, the phonetic converting unit 12 decomposes the acquired KANJI-character string into KANJI-character idioms (alternatively, KANJI-characters) having such sizes that the homonym discrimination information is defined in the homonym dictionary 17, and then executes a process operation corresponding to the process operations defined at the steps S110 and S111 with respect to each of the decomposed KANJI-character idioms. That is, in such a case as the KANJI-character string made of two KANJI-character idioms stored in the homonym dictionary 17 is contained in the declarative sentence data, the phonetic converting unit 12 outputs such data as attached with the character number discrimination information and the homonym discrimination information before/after a first KANJI-character idiom for constituting this KANJI-character series, and thereafter outputs such data attached with the character number discrimination information and the homonym discrimination information before/after a second KANJI-character idiom thereof. Subsequently, the phonetic converting unit 12 outputs characters other than KANJI-characters located subsequent to this KANJI-character string. Then, the phonetic converting unit 12 directly outputs the unit information acquired from the declarative sentence data when this unit information indicates characters other than the KANJI-characters. As a consequence, for instance, such a Japanese language sentence "半導体製品の売り上げは好調です。 ("Semiconductor products sell well")" may be converted into data (phonetic data) as schematically illustrated in FIG. 5 by the phonetic converting unit 12.

In the data compressing/decompressing apparatus according to the first embodiment, such phonetic data outputted from the phonetic converting unit 12 is compressed by the lossless compressing unit 13. Then, the compression result by the lossless compressing unit 13 is stored as compression data into the storage unit 11, so that the data compressing operation is complete. In other words, in this data compressing/decompressing apparatus, the compressed declarative sentence data can be decompressed to be restored to the original condition (decompression sequence will be explained later), and furthermore the declarative sentence data can be converted into the phonetic data equal to such data as the sorts of characters under use are fewer than those of this declarative sentence. Then, this phonetic data can be compressed. As a consequence, in accordance with this data compressing/decompressing apparatus, the statistical information during the compression operation can be acquired in higher efficiency than the case where the declarative sentence data is directly compressed. As a result, the data compression in higher compression rate can be realized.

Next, a description will now be made of data decompressing operation by the data compressing/decompressing apparatus according to the first embodiment.

The lossless decompressing unit 14 reads the compression data from the storage unit 11, which is instructed as data to be decompressed, and supplies the phonetic inverting unit 15 with a decompression result of this compression data, namely with phonetic data produced by the phonetic converting unit 12 based on certain declarative sentence data.

As apparent from the above-described operation by the phonetic converting unit 12, the 2-byte character, the 1-byte character, the character number discrimination information, and the homonym discrimination information are contained in the phonetic data (see FIG. 5). As to the homonym discrimination information among them, since this discrimination information corresponds to 1-byte information in which the numeral value is expressed by the binary number, this homonym discrimination information cannot be discriminated from the 1-byte character and the like. However, the character number discrimination information discriminatable from the 1-byte character and also the first byte of the 2-byte character is located before this homonym discrimination information. Also, the homonym discrimination information is present at the position where the character number discrimination information is located, and at a position determined by the content thereof.

Figure 6:
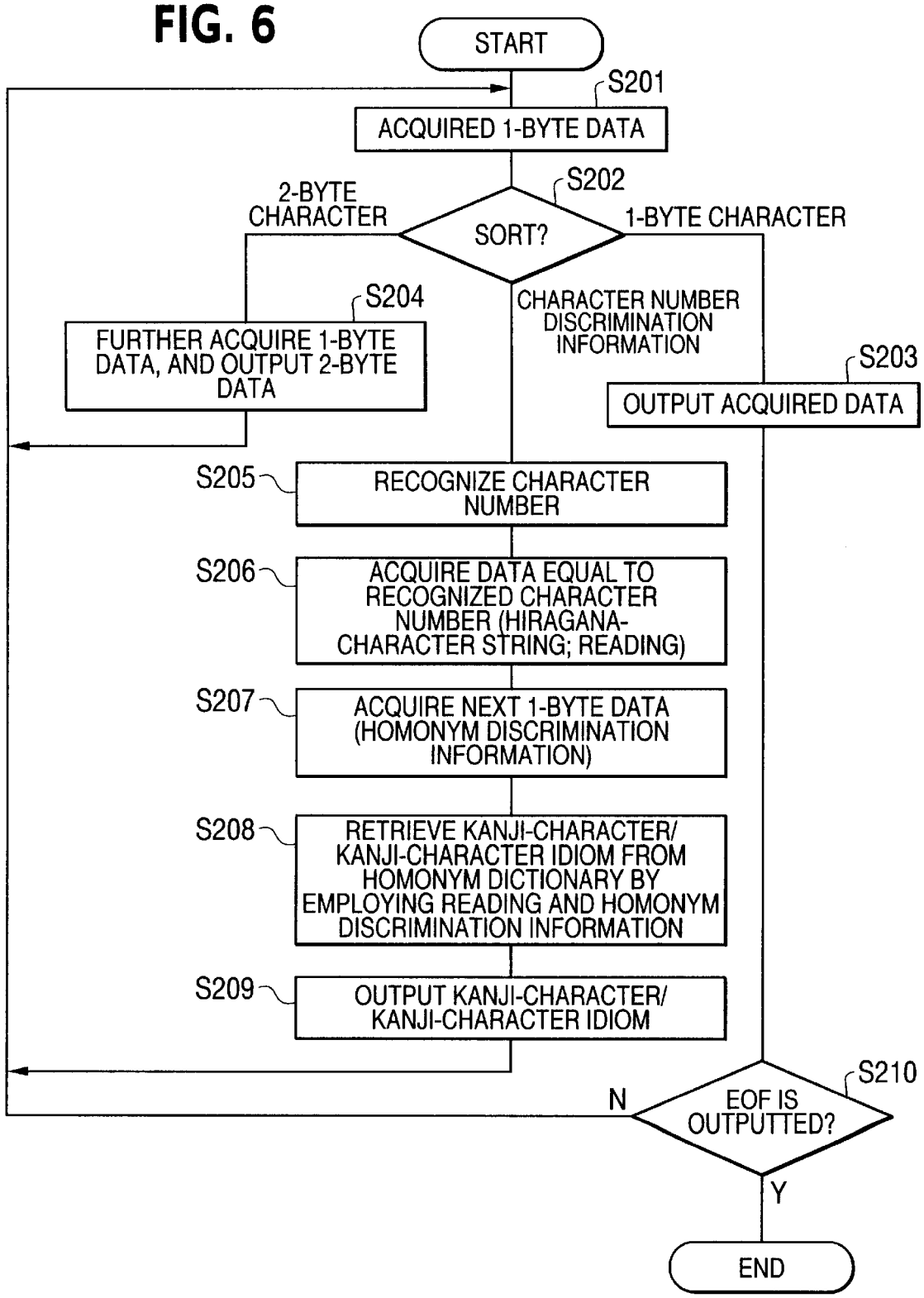
FIG. 6 represents sequential operation of a phonetic inverting unit employed in the data compressing/decompressing apparatus according to the first embodiment.

As a result, the phonetic inverting unit 15 restores the declarative sentence data from the phonetic data in accordance with a flow chart shown in FIG. 6.

First, the phonetic inverting unit 15 acquires 1-byte data from the lossless decompressing unit 14 (step S201). Then, this phonetic inverting unit 15 judges whether this 1-byte data corresponds to the 1-byte character, the first 1-byte of the 2-byte character, or the character number discrimination information (step S202).

When the acquired data is data indicative of the 1-type character (step S202; 1-byte character), the phonetic inverting unit 15 directly outputs this data to the storage unit 11 (step S203). Then, when the outputted data is not equal to "EOF" (step S210; N), the decompression operation is returned to the step S201 at which the next 1-byte data is acquired from the lossless decompressing unit 14. When the acquired data is equal to the first byte of the 2-byte character (step S202; 2-byte character), the phonetic inverting unit 15 further acquires 1-byte data, and then outputs these 2-byte data to the storage unit 11 (step S204). Thereafter, the process operation is returned to the step S201.

In such a case as the acquired data is the character number discrimination information (step S202; character number discrimination information), the phonetic inverting unit 15 recognizes the character number of the subsequent HIRAGANA-character string based on the content of this character number discrimination information (step S205). Then, the phonetic inverting unit 15 acquires the data constructed of the recognized character number (character number×2-byte data; "reading"), and also next 1-byte data (homonym discrimination information) from the lossless decompressing unit 14 (steps S206 and S207). Subsequently, the phonetic inverting unit 15 retrieves either a KANJI-character or a KANJI-character idiom from the homonym dictionary 18 by using the acquired reading and the acquired homonym discrimination information (step S208). Then, the retrieved KANJI-character, or the retrieved KANJI-character idiom is outputted to the storage unit 11, and the process operation is returned to the previous step S201.

The phonetic inverting unit 15 repeatedly executes the above-described operations with respect to each of the data acquired from the lossless decompressing unit 14. When the phonetic inverting unit 15 outputs "EOF" (step S210; Y), this process operation is complete.

MODIFIED FIRST EMBODIMENT MODE

In accordance with the data compressing/decompressing apparatus of the first embodiment, either the KANJI-character or the KANJI-character idiom contained in the declarative sentence data is replaced by the data constructed of the character number discrimination information, the reading, and the homonym discrimination information to thereby produce the phonetic data having this replacement mode. As apparent from the foregoing description, this data compressing/decompressing apparatus may be constituted in such an alternative manner as phonetic data may be produced with a format in which both the homonym discrimination information and the reading are added after the character number discrimination information in this order.

Also, while both starting position discrimination information and end position discrimination information are prepared instead of a plurality of character number discrimination information, the data compressing/decompressing apparatus may be arranged so that when the KANJI-character reading is outputted during the data compression, the starting position discrimination information and the end position discrimination information are added before/after this KANJI-character reading. In this case, the homonym discrimination information is located immediately after the starting position discrimination information, or the end position discrimination information. Also, the data compressing/decompressing apparatus may be arranged in such a manner as the data is decompressed by returning the reading existing between the starting position discrimination information and the end position discrimination information into the KANJI-character.

In the above-explained data compressing/decompressing apparatus of the first embodiment, when the Chinese-style-reading KANJI-character made of 1 character is processed, this KANJI-character code is directly outputted. Alternatively, this data compressing/decompressing apparatus may be arranged so that one KANJI-character that is originally read in Chinese-style is also converted into the reading by reading the KANJI-character in Japanese-style.

Although the data compressing/decompressing apparatus of the first embodiment is directed to the shift JIS code, this apparatus may be directed to other code systems such as JIS and EUC. Furthermore, the above-explained technique of the first embodiment may be applied not only to the Japanese language, but also any other languages which require definitions of plural byte characters.

SECOND EMBODIMENT MODE

In the data compressing/decompressing apparatus of the first embodiment, after the KANJI-character idiom contained in the declarative sentence data is converted into the phonetic data having such a format as this KANJI-character idiom is replaced by the data containing this KANJI-character idiom reading, this phonetic data is compressed. In contrast thereto, a data compressing/decompressing apparatus according to a second embodiment of the present invention substitutes the data other than the KANJI-character idiom for data with other formats when the phonetic data is produced. Also, in the data compressing/decompressing apparatus according to the second embodiment, as data for replacing the KANJI-character idiom, such a data is employed as contains half-sized reading (namely, information about reading expressed by half-sized KATAKANA-character string, 1 byte code in JIS and Shift JIS code, 2 byte code in EUC code) of this KANJI-character idiom.

Figure 7:
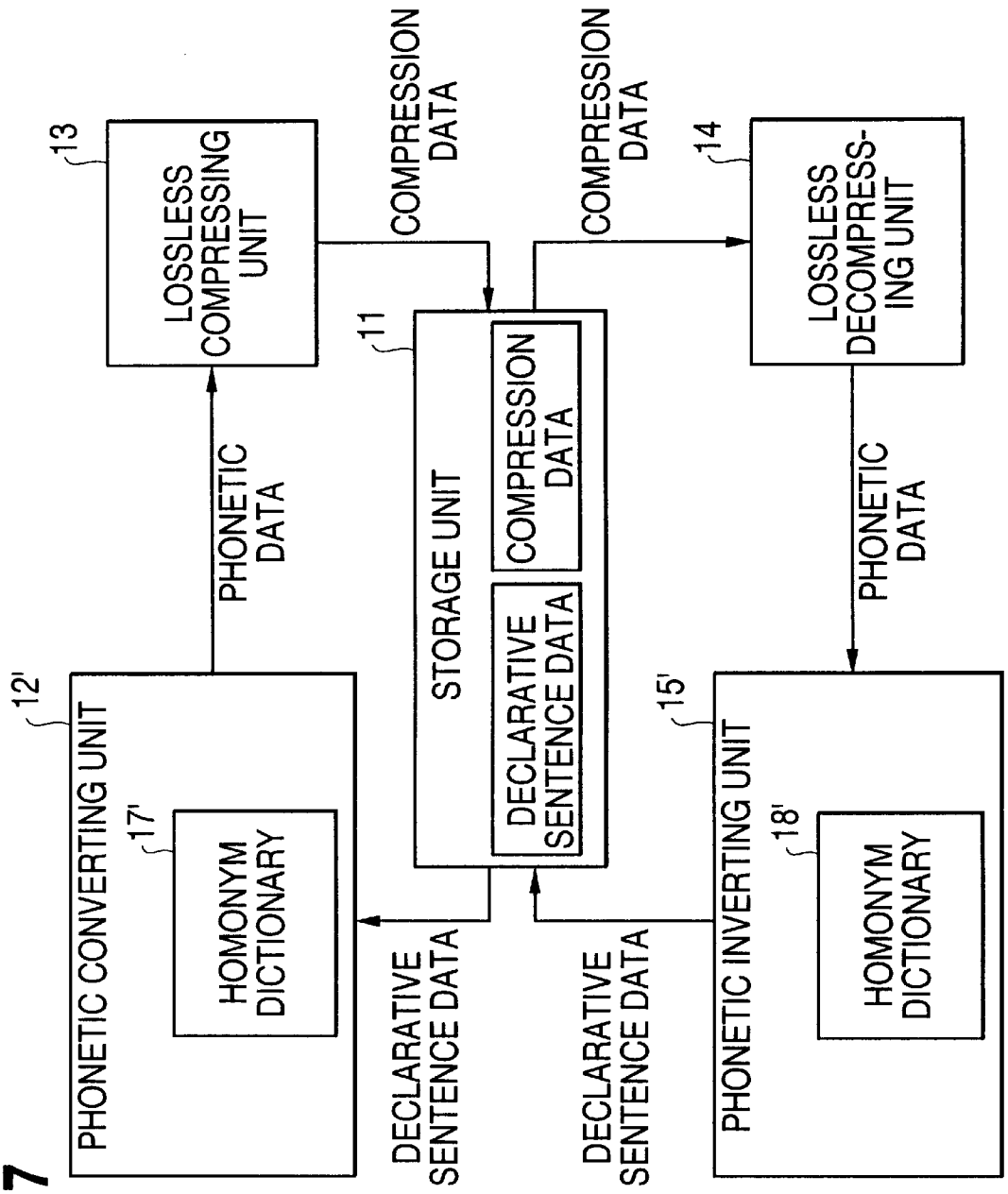
FIG. 7 is a functional block diagram for showing a data compressing/decompressing apparatus according to a second embodiment of the present invention.

FIG. 7 is a functional block diagram for indicating the data compressing/decompressing apparatus according to the second embodiment. As apparent from this drawing, a basic arrangement of the data compressing/decompressing apparatus according to the second embodiment is similar to that of the data compressing/decompressing apparatus according to the first embodiment. It should be understood that a phonetic converting unit 12' employed in the data compressing/decompressing apparatus of the second embodiment contains only a homonym dictionary 17'. This homonym dictionary 17' is different from the above-explained homonym dictionary 17, and stores a correspondence relationship among the KANJI-characters or the KANJI-character idioms, the half-sized reading (namely, information about reading expressed by half-sized KATAKANA-character strings), and the homonym discrimination information. Also, a homonym dictionary 18' having the same content as the above-described homonym dictionary 17' is provided in a phonetic inverting unit 15'.

Figure 8:
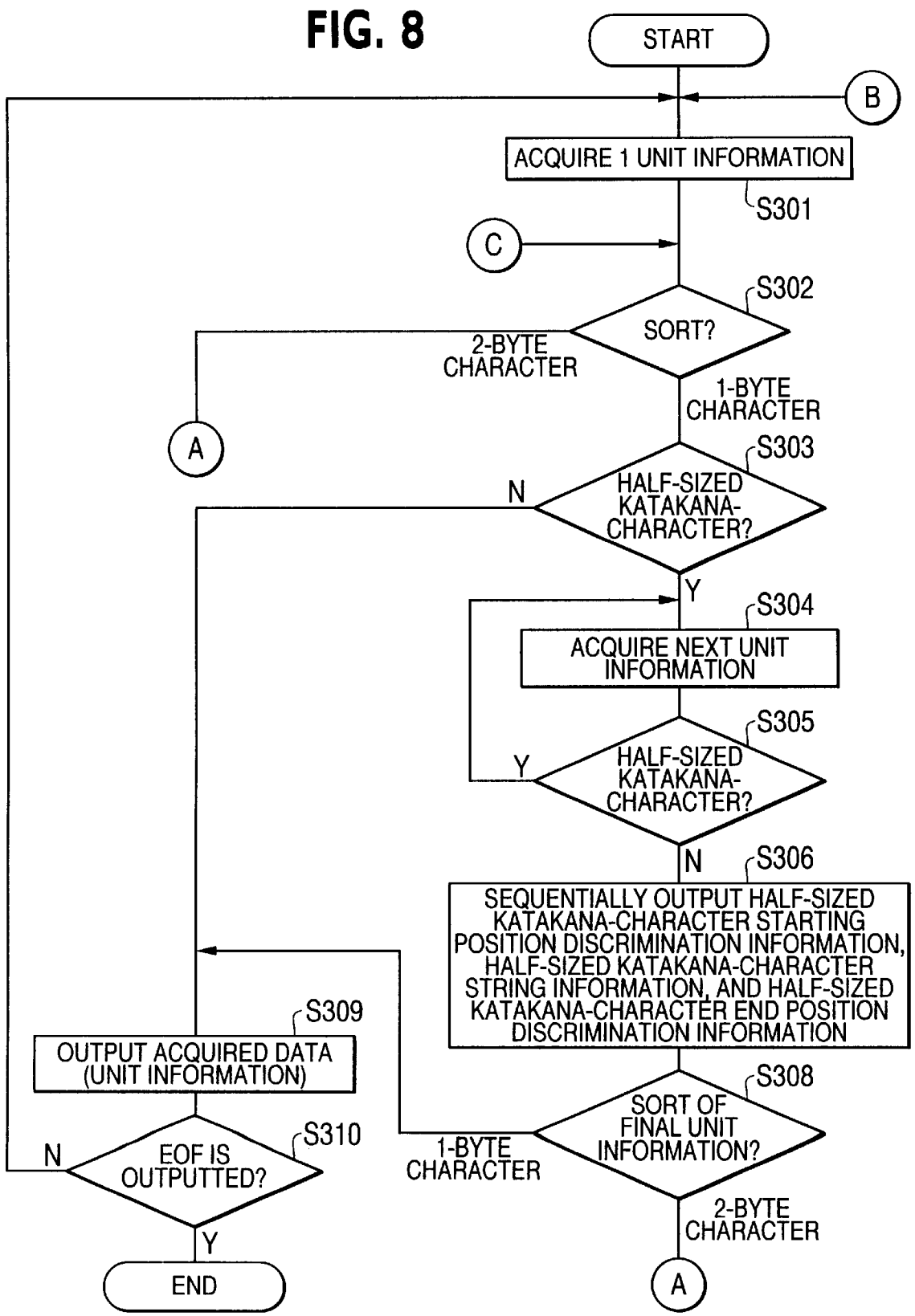
FIG. 8 is a flow chart for explaining sequential operation of a phonetic converting unit employed in the data compressing/decompressing apparatus according to the second embodiment.

Then, the phonetic converting unit 12' produces phonetic data from declarative sentence data in accordance with a sequential operation defined in a flow chart shown in FIG. 8 when a data compression is carried out.

First, the phonetic converting unit 12' acquires data with single unit information from declarative sentence data to be compressed (step S301). Then, when this data corresponds to 1-byte character (step S302; 1-type character), the phonetic converting unit 12' judges whether or not a character expressed by this data is equal to a half-sized KATAKANA-character (step S303). In the case that this character is not equal to the half-sized KATAKANA-character (step S303; N), namely is equal to a control character and a Roman alphabet, the phonetic converting unit 12' directly outputs this data to the lossless compressing unit 13 (step S309). Then, when this data is not equal to "EOF" (step S310; N), the process operation is returned to the step S301 at which the process operation is commenced with respect to next data for constituting the declarative sentence data.

In such a case as the acquired 1-byte character is equal to the half-sized KATAKANA-character (step S303; Y), the phonetic converting unit 12' acquires next unit information (1 byte or 2-byte character) (step S304). Then, when a character expressed by the acquired unit information is equal to the half-sized KATAKANA character (step S305; Y), the process operation is returned to the step S304. On the other hand, when this character is not equal to the half-sized KATAKANA-character (step S305; N), the process operation is advanced to a step S306. In other words, the phonetic converting unit 12' executes the loop defined by the step S304 and the step S305, so that this phonetic converting unit 12' acquires the unit information about the character string where the half-sized KATAKANA-characters are continuous in series, and about the next one character from the declarative sentence data.

Thereafter, the phonetic converting unit 12' outputs half-sized KATAKANA-character starting position discrimination information, a half-sized KATAKANA-character string, and an end position discrimination information in this order (step S306). It should be noted that the half-sized KATAKANA-character starting position discrimination information and the end position discrimination information are 1-byte information in which the contents thereof are set in order to be discriminatable from the 1-byte character, the 2-byte character, and the character number discrimination information. While the data is decompressed (will be explained later in detail), the data existing between these position discrimination information may be judged as data to be outputted as the half-sized KATAKANA-character (namely, be directly outputted).

Next, the phonetic converting unit 12' judges whether or not the character indicated by the unit information acquired at the finally executed step S304 corresponds to the 1-byte character, or the 2-byte character (step S308). Then, when this character is equal to the 1-byte character (step S308; 1-byte character), the process operation is advanced to a step S309. At this step, the 1-byte character which is not equal to this half-sized KATAKANA-character is outputted to the lossless compressing unit 13.

Figure 9:
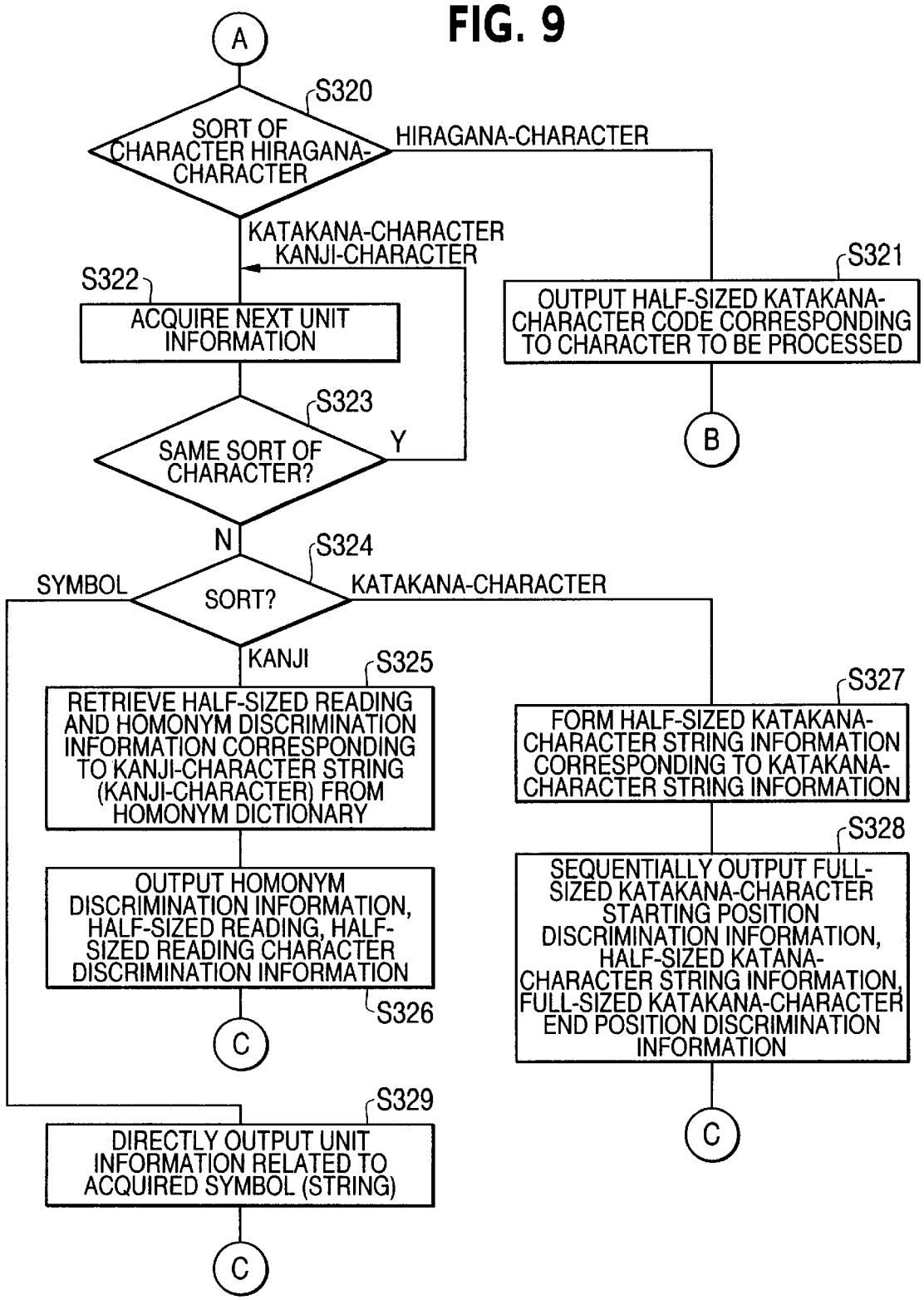
FIG. 9 is a flow chart for describing sequential operation of the phonetic converting unit employed in the data compressing/decompressing apparatus according to the second embodiment.

On the other hand, when the finally acquired unit information is equal to the 2-byte character (step S308; 2-byte character), and also when the character expressed by the unit information acquired at the step S301 is equal to the 2-byte character (step S302; 2-byte character), as indicated in FIG. 9, the phonetic converting unit 12' judges whether or not this 2-byte character corresponds to the HIRAGANA-character, the KANJI-character, the KATAKANA-character, or the symbol (horizontal rule element) (step S320). Concretely speaking, the phonetic converting unit 12' judges whether or not the corresponding half-sized KATAKANA-character is equal to the existing character (HIRAGANA-character, punctuation, etc.). Then, if the corresponding half-sized KATAKANA-character is equal to the existing character (step S320; HIRAGANA-character), then a half-sized KATAKANA-character code corresponding to this 2-byte character (namely, character to be processed) is outputted (step S321), and the process operation is returned to the step S301 of FIG. 8.

On the other hand, when the corresponding KATAKANA-character is equal to the not-existing character (step S320; KATAKANA-character, KANJI-character, etc.), the phonetic converting unit 12' repeatedly acquires the unit information from the declarative sentence data until it acquires such a character having a different sort from that of the character to be processed (steps S322, and S323). In other words, when the character to be processed is equal to the KATAKANA-character, the phonetic converting unit 12' repeatedly acquires the unit information until any character (KANJI-character, HIRAGANA-character, 1-byte character) other than the KATAKANA-character appears. When the character to be processed is equal to the KANJI-character, the phonetic converting unit 12' repeatedly acquires the unit information until any character other than the KANJI-character appears. Also, when the character to be processed is equal to the symbol or the like, the phonetic converting apparatus 12' repeatedly performs the unit information acquisition until the KANJI-character or the KATAKANA-character appears.

Then, when the unit information indicative of the character having the different sort can be acquired (step S323; N), if the sort of the acquired character is the KANJI-character (step S324; N), then the phonetic converting unit 12' retrieves from the homonym dictionary 17', the half-sized reading and the homonym discrimination information which correspond to the acquired KANJI-character string (or KANJI-character) (step S325). Subsequently, the phonetic converting unit 12' outputs the character number discrimination information corresponding to the character number (byte number) of the half-sized reading, the half-sized reading, and the retrieved homonym discrimination information in this order to the lossless compressing unit 13 (step S326). Then, the process operation is returned to the step S302 of FIG. 8, at which the process operation for the finally acquired unit information is commenced.

In the case that the sort of the character is equal to the KATAKANA-character (step S324; Y), half-sized KATAKANA-character string information corresponding to the acquired KATAKANA-character string information is produced (step S327). Then, full-sized KATAKANA-character starting position discrimination information, half-sized KATAKANA-character string information, and end position discrimination information are outputted in this order to the lossless compressing unit 13 (step S328). Then, the process operation is returned to the step S302 at which the process operation for the finally acquired character is commenced. It should be noted that the full-sized KATAKANA-character starting position discrimination information is equal to 1-byte information whose content is set in order to be discriminatable from the 1-byte character, the 2-byte character, the character number discrimination information, the half-sized KATAKANA-character starting position discrimination information, and the end position discrimination information. When the data is restored, the data existing between the full-sized KATAKANA-character starting position discrimination information and the end position discrimination information is converted into the full-sized KATAKANA-character which is judged as data to be outputted.

Also, when the sort of the character is equal to the symbol (step S324; symbol), the phonetic converting unit 12' directly outputs the unit information (string) related to the acquired symbol (string) to the lossless compressing unit 13, and then the process operation is returned to the step S320 of FIG. 8, at which the process operation for the finally acquired unit information is commenced.

The phonetic converting unit 12' repeatedly perform such a process operation, and when "EOF" is outputted (step S310; Y), the process operation for the declarative sentence data to be processed is accomplished.

As previously described, the phonetic converting unit 12' replaces the HIRAGANA-character contained in the declarative sentence data into the half-sized KATAKANA-character, and also replaces the KANJI-character idiom based on such an information constructed of the reading expressed by the character number discrimination information and the half-sized KATAKANA-character series, and the homonym discrimination information. Further, the phonetic converting unit 12' replaces the full-sized KATAKANA-character string based upon such an information constructed of the full-sized KATAKANA-character starting position discrimination information, the half-sized KATAKANA-character string having the same value as the full-sized KATAKANA-character string thereof, and the end position discrimination information. Then, this phonetic converting unit 12' replaces the half-sized KATAKANA-character string based upon such an information constructed of the half-sized KATAKANA-character starting position discrimination information, the half-sized KATAKANA-character string having the same value as the full-sized KATAKANA-character string thereof, and the end position discrimination information.

As a consequence, as illustrated in FIG. 10, a sentence containing no symbol, e.g., "データをメモリに保存すると . . . " is converted by the phonetic converting unit 12' into the phonetic data containing only the 1-byte character, and the several sorts of discrimination information equal to the 1-byte information.

Then, since such a phonetic data is compressed by the lossless compressing unit 13, the declarative sentence data can be more effectively compressed by the data compressing/decompressing apparatus according to this embodiment, as compared with such a case as the declarative sentence data is directly compressed. Concretely speaking, as schematically illustrated in FIG. 11, in the conventional data compressing/decompressing apparatus for directly compressing the declarative sentence data, since 1 character is equal to 2 bytes, when a first byte of a certain 2-byte character (in FIG. 11, "と") is a character of interest, only 1 character existing before this 2-byte character is handled as a context. To the contrary, since 1 character is equal to 1 byte in this data compressing/decompressing apparatus of the second embodiment, when a certain character ("ト") is a character of interest, two characters located before this character are handled as a context. Accordingly, in accordance with the data compressing/decompressing apparatus of the second embodiment mode, the data can be compressed in higher compression rate.

Now, a brief explanation will be made of operations when data is decompressed to be restored in the data compressing/decompressing apparatus according to the second embodiment mode.

Figure 12:
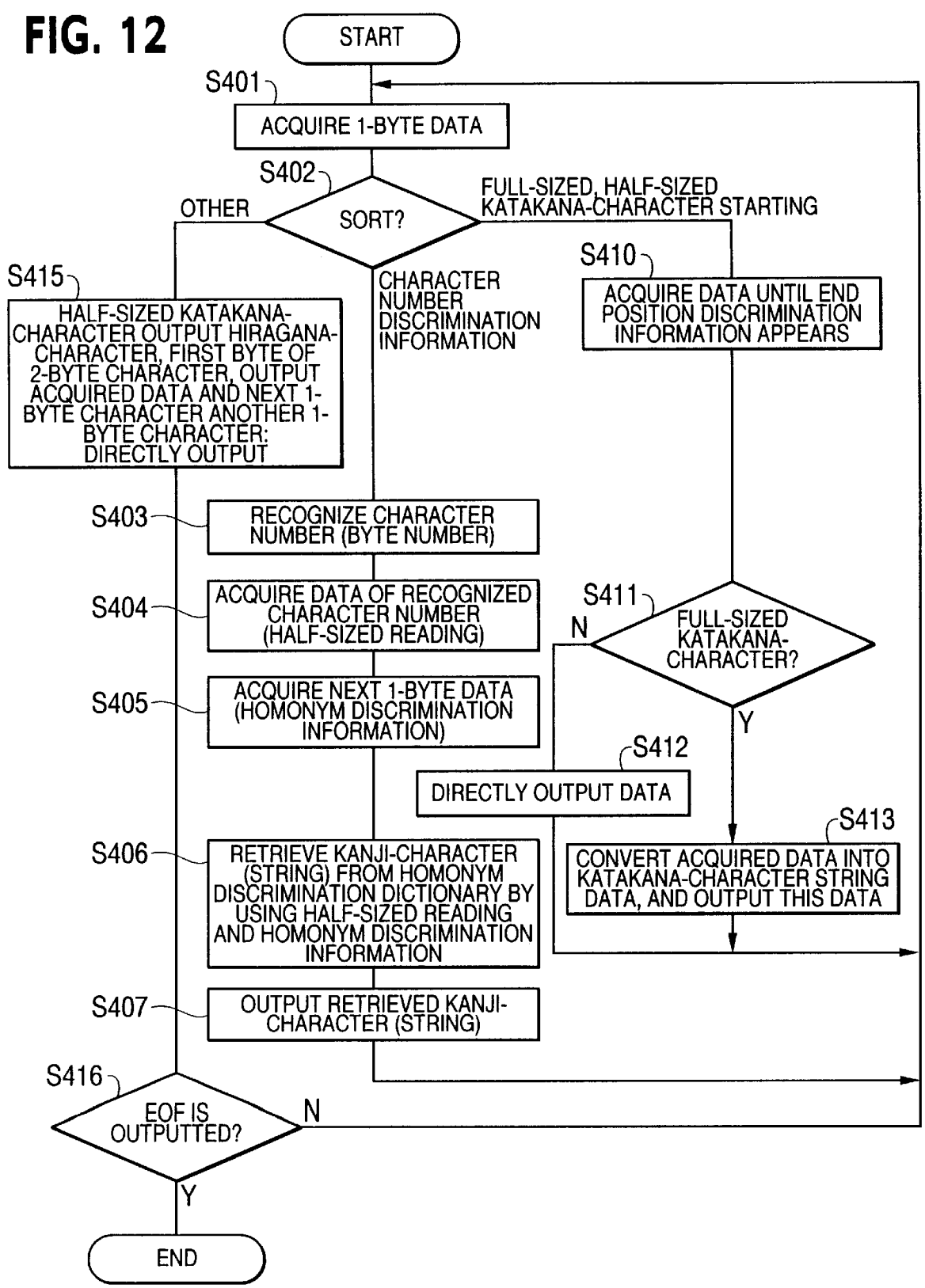
FIG. 12 represents sequential operation of a phonetic inverting unit employed in the data compressing/decompressing apparatus according to the second embodiment.

As indicated in FIG. 12, when the data is decompressed, the phonetic inverting unit 15' firstly acquires 1-byte data outputted from the lossless decompressing unit 14 (step S401). Subsequently, the phonetic inverting unit 15' judges whether or not this acquired 1-byte data corresponds to the character number discrimination information, the full-sized KATAKANA-character starting position discrimination information, the half-sized KATAKANA-character starting position discrimination information, the data for indicating the half-sized KATAKANA-character, or the data for indicating the KANJI-character (symbol) (step S402).

Then, when this data is equal to the character number discrimination information (step S402; character number discrimination information), the phonetic inverting unit 15' recognizes a character number (byte number) from this character number discrimination information (step S403), and acquires data (half-sized reading) equal to the recognized character number from the lossless decompressing unit 14 (step S404). Thereafter, the phonetic inverting unit 15' acquires next 1-byte data, namely the homonym discrimination information (step S405). Subsequently, the phonetic inverting unit 15' retrieves information indicative of either the KANJI-character or the KANJI-character string from the homonym dictionary 17' by using the acquired half-sized reading and the acquired homonym discrimination information (step S406), and then outputs the retrieved KANJI-character (string) information to the storage unit 11 (step S407). Thereafter, the process operation is returned to the step S401 at which the process operation related to the remaining data is commenced.

At the step S402, in such a case as the phonetic inverting unit 15' detects it the data acquired at the step S401 corresponds to either the full-sized KATAKANA-character starting position discrimination information or the half-sized KATAKANA-character starting position discrimination information, the phonetic inverting unit 15' repeatedly acquires the data from the lossless decompressing unit 14 until the end position discrimination information is acquired (step S410). Then, when the end position discrimination information is acquired, the phonetic inverting unit 15' accomplishes the process of the step S410. In such a case as the process operation under execution is to detect the full-sized KATAKANA-character starting position discrimination information (step S411; Y), the data (other than end position discrimination information) related to the half-sized KATAKANA-character (string) acquired at the step S410 is converted into the data related to the full-sized KATAKANA-character (string) which will be then outputted to the storage unit 11 (step S413). Then, the process operation is returned to the step S401. On the other hand, when the process operation under execution is to detect the half-sized KATAKANA-character starting position discrimination information (step S411; N), the data (other than end position discrimination information) related to the acquired half-sized KATAKANA-character (string) is directly outputted to the storage unit 11 (step S412), and the process operation is returned to the step S401.

When the data acquired at the step S401 is equal to either the 1-byte character or the first byte of the 2-byte character (step S402; others), the phonetic inverting unit 15' executes the following process operation at the step S415. That is, as to the half-sized KATAKANA data, the corresponding HIRAGANA-character code is outputted. As to the first byte of the 2-byte character, another 1-byte data is further acquired from the lossless decompressing unit 14, and these 2-byte data are outputted. As to another 1-byte character, the acquired data is directly outputted to the storage unit 11.

The phonetic inverting unit 15' repeatedly performs such a process operation, and when "EOF" is outputted (step S417; Y), the process operation shown in FIG. 12 is complete.

MODIFIED SECOND EMBODIMENT MODE

The data compressing/decompressing apparatus according to the second embodiment may be modified in a similar manner to the data compressing/decompressing apparatus of the first embodiment. In other words, while the starting position discrimination information and the end position discrimination information are prepared instead of a plurality of character number discrimination information, the apparatus may be arranged in such a manner as when the half-sized reading of the KANJI-character is outputted during the data compression, the starting position discrimination information and the end position discrimination information are added before/after this half-sized reading. Otherwise, this apparatus may be directed to compress/decompress texts of other code systems.

Although the data compressing/decompressing apparatus of the second embodiment converts the 2-byte character into the half-sized KATAKANA-character, this data compressing/decompressing apparatus may be arranged alternatively so as to convert the 2-byte character into the Roman alphabet. That is, this data compressing/decompressing apparatus may be arranged so as to output such data indicative of "SEIZOU", instead of the data for indicating "セイゾウ".

In such a case as the data compressing/decompressing technique is applied to a language constituted only by a 2-byte ideograph, for instance, while a 1-byte code is allocated to the international phonetic symbol, the information indicative of a vowel and a consonant of the Hangul alphabet, and the information indicative of Chinese alphabet (Pinyin in Mainland China, or Zhuyin in Taiwan), the respective ideograph data may be processed by converting sounds of this ideograph into the code expressed by the international phonetic symbol and the like.

THIRD EMBODIMENT MODE

Figure 13:
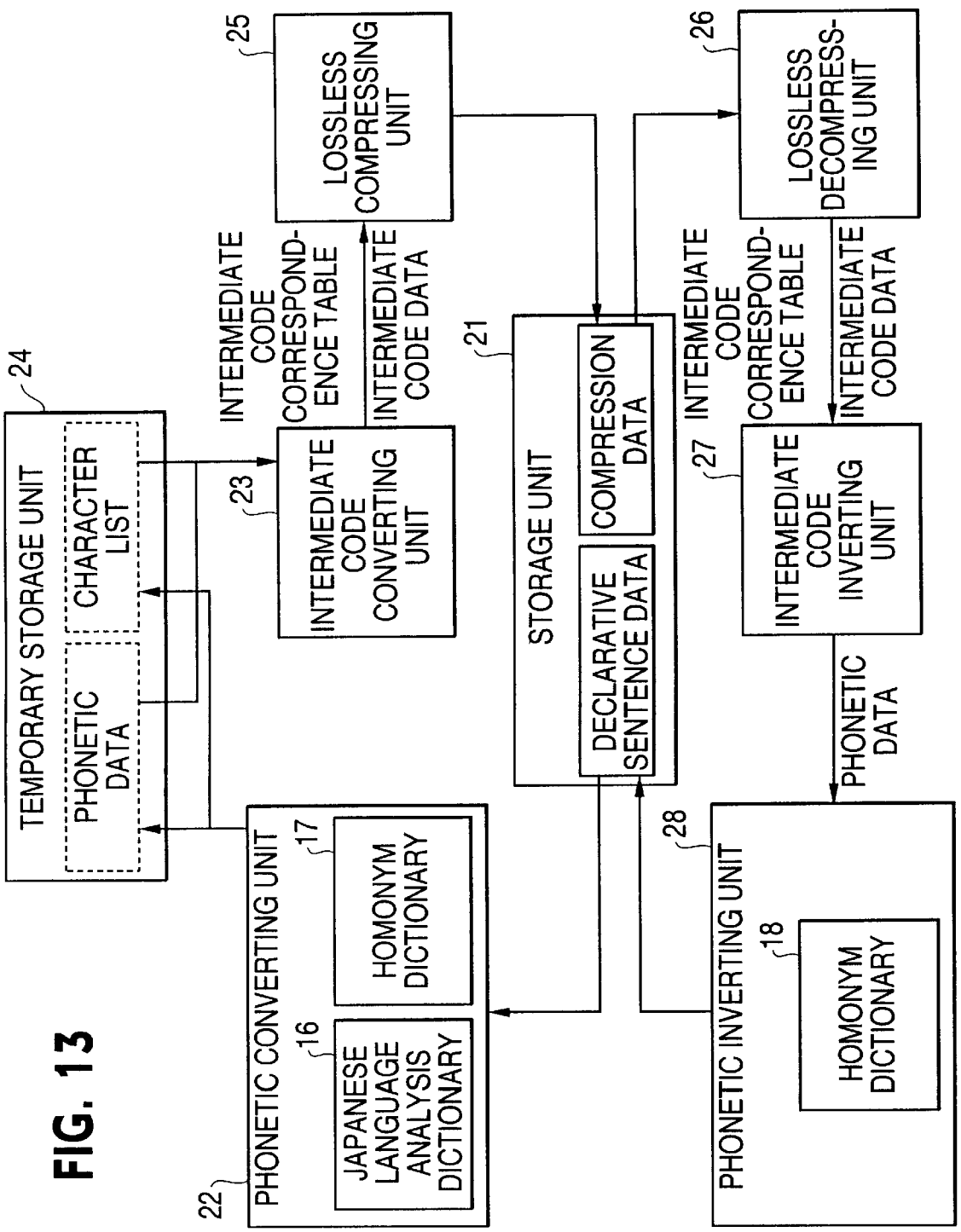
FIG. 13 is a functional block diagram for showing a data compressing/decompressing apparatus according to a third embodiment of the present invention.

FIG. 13 is a functional block diagram for showing a data compressing/decompressing apparatus of a third embodiment of the present invention. Referring now to this drawing, operations of the data compressing/decompressing apparatus of the third embodiment will be summarized.

As indicated in FIG. 13, the data compressing/decompressing apparatus of the third embodiment is equipped with a storage unit 21 used to store declarative sentence data and compression data. Further, this apparatus is equipped with a phonetic converting unit 22, an intermediate code converting unit 23, a temporary storage unit 24, and a lossless compressing unit 25 as a block functioning when data is compressed. Then, this apparatus is equipped with a lossless decompressing unit 26, an intermediate code inverting apparatus 27, and a phonetic inverting apparatus 28.

A Japanese language analysis dictionary 16 and a homonym dictionary 17 contained in the phonetic converting unit 22 are the same as those dictionaries owned by the phonetic converting unit 12 of the first embodiment. The phonetic converting unit 22 converts the KANJI-characters contained in the declarative sentence data into the "reading thereof" by using these dictionaries 16 and 17 to thereby produce phonetic data in the substantially same sequence as that of the phonetic converting unit 12 of the first embodiment. It should be noted that the phonetic converting unit 22 also produces a character list corresponding to the list of the characters and the discrimination information used in the phonetic data when the phonetic data is produced.

The immediate code converting unit 23 forms an intermediate code correspondence table by using phonetic data and a character list produced in the temporary storage unit 24 by the phonetic converting unit 22. This intermediate code correspondence table is used to allocate a new code (intermediate code) to a character, or discrimination information used in the phonetic data. Then, the intermediate code converting unit 23 converts the phonetic data into intermediate code data corresponding to the data containing the intermediate code by using this intermediate code table. It should be understood that there are prepared a mode for not designating the bit number of the intermediate code (bit length non-designation mode), and another mode for designating the bit number of the intermediate code (bit length designation mode) as an operation mode, and when the apparatus is operated in the bit length designation mode, the information for designating the bit length of the intermediate code is given to the intermediate code converting unit 23 prior to the data compression operation.

The lossless compressing unit 25 compresses the intermediate code correspondence table and the intermediate code data given from the intermediate code converting unit 23 under no loss condition, and causes these compression results to be stored into the storage unit 21 as compression data.

The lossless decompressing unit 26 owns a function capable of decompressing the data compressed by the lossless compressing unit 25, and decompresses the intermediate code correspondence table and the intermediate code data based upon the compression data instructed to be decompressed, and then outputs the decompressed intermediate code correspondence table and the decompressed intermediate code data. The intermediate code inverting unit 27 returns an intermediate code contained in the subsequently supplied intermediate code data to original information (phonetic data) by employing the intermediate code correspondence table given from the lossless decompressing unit 26. The phonetic inverting unit 28 returns the "reading" contained in the phonetic data to the KANJI-character by using a homonym dictionary 18 corresponding to the dictionary having the same content as the homonym dictionary 17. As a result, this phonetic inverting unit 28 produces, within the storage unit 21, the declarative sentence data equal to the original information of the compression data processed by the lossless decompressing unit 26.

Now, operations of the respective circuit portions in the data compressing/decompressing apparatus according to the third embodiment will be described in detail. Referring now to a flow chart of FIG. 14, operation of the phonetic converting unit 22 will be explained.

Figure 14:
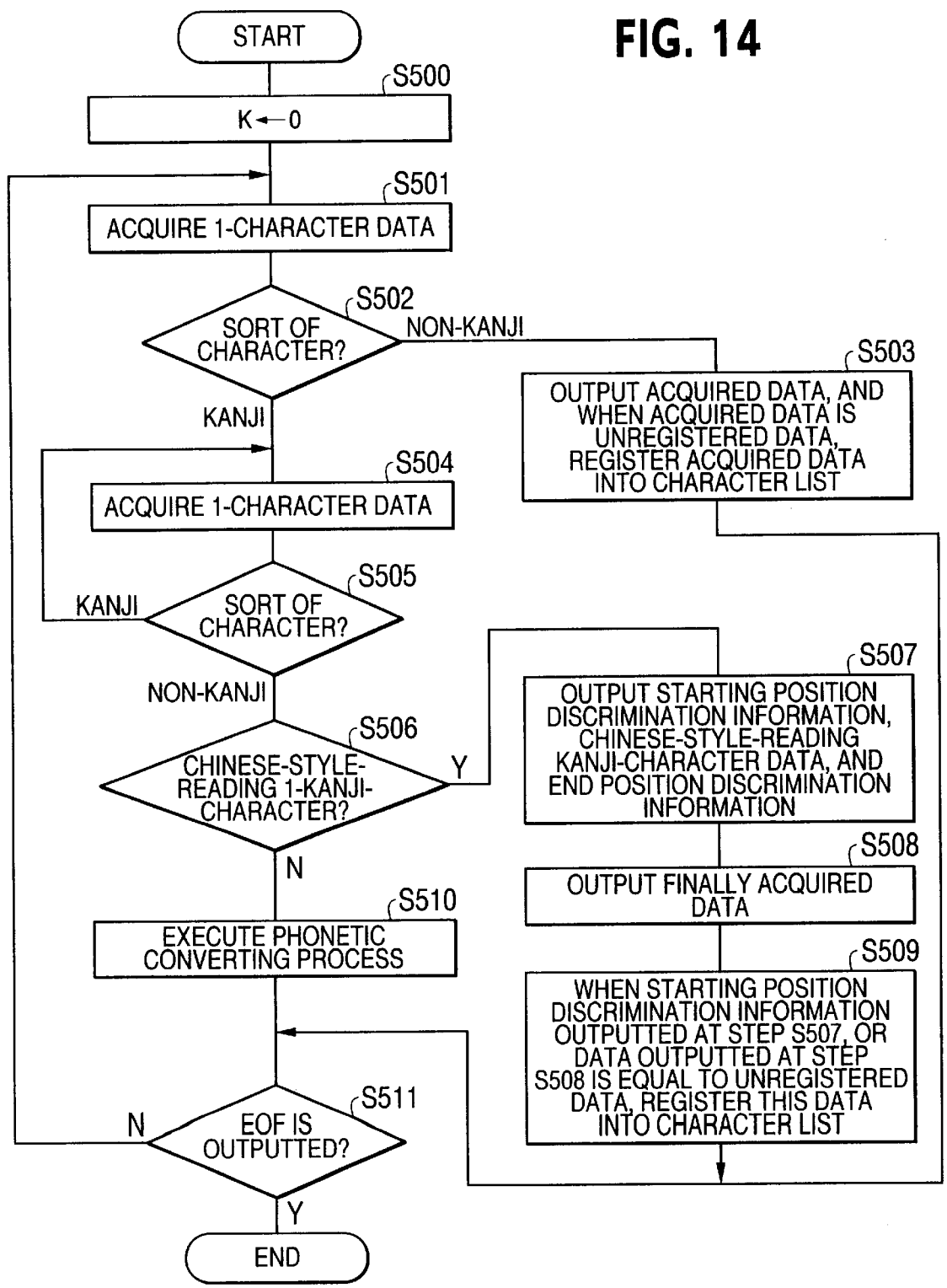
FIG. 14 is a flow chart for describing sequential operation of a phonetic converting unit employed in the data compressing/decompressing apparatus according to the third embodiment.

As indicated in FIG. 14, when the commencement of the data compression is instructed, the phonetic converting unit 22 first set "0" to a variable K (step S500). Although the usage of the variable K will be explained later, the variable K is such a variable that the maximum value of the homonym discrimination information outputted by the phonetic converting unit 22 is stored.

Next, the phonetic converting unit 22 acquires data about 1-character from the declarative sentence data designated to be compressed (step S501). Subsequently, the phonetic converting unit 22 judges a sort of a character indicated by this data. When this character corresponds to the non-KANJI-character (step S502; non-KANJI-character), the phonetic converting unit 22 outputs the acquired data to the temporary storage unit 24. When this data corresponds to unregistered data in which this data is not registered in the character list, the phonetic converting unit 22 registers this data into the character list (step S503). Then, in such a case that the outputted data is not equal to "EOF" (step S511; N), the process operation is returned to the step S501 at which the process operation for the next 1-character data contained in the declarative sentence data is commenced.

In the case that the data read at the step S501 corresponds to the data indicative of the KANJI-character (step S502; KANJI-character), the phonetic converting unit 22 repeatedly acquires the data from the declarative sentence data until the non-KANJI-character data is acquired (steps S504 and S505). When the non-KANJI-character data is acquired (step S505; non-KANJI-character), the process operation by the phonetic converting unit 22 is advanced to a step S506.

At the step S506, the phonetic converting unit 22 judges whether or not the data acquired before this non-KANJI-character data corresponds to data about 1 KANJI-character of Chinese-style-reading. Then, when this data corresponds to the data about 1 KANJI-character of Chinese-style-reading (step S506; Y), the starting position discrimination information, the Chinese-style-reading KANJI-character data, and the end position discrimination information are outputted into the temporary storage unit 24 (step S507). It should be noted that both the starting position discrimination information and the end position discrimination information are 1-byte information whose content is set in order to be discriminative from the 1-byte character, and the first byte of the 2-byte character. In this embodiment, the same information is used as the starting position discrimination information and the end position discrimination information.

After executing the step S507, the phonetic converting unit 22 outputs the finally acquired data (non-KANJI-character data) to the temporary storage unit 24 (step S508). Subsequently, in such a case as the starting position discrimination information outputted at the step S507 corresponds to the unregistered data which is not registered in the character list, this data (starting position discrimination information) is registered in the character list. Also, when the data outputted at the step S508 corresponds to the unregistered data, this data is registered into this data character list (step S509). That is, when the phonetic converting unit 22 firstly executes the step S509, the starting position discrimination information is registered into the character list. When the data existing subsequent to the end position discrimination information corresponds to the unregistered data, this data is also registered. Then, when the phonetic converting unit 22 executes the step S509 after the second process operation, since the starting position discrimination information has been registered, the data is registered into the character list only when the data existing subsequent to the end position discrimination information corresponds to the unregistered data.

Then, when the data outputted at the step S508 is not equal to "EOF" (step S511; N), the process operation by the phonetic converting unit 22 is returned to the step S501.

On the other hand, when the data acquired before the non-KANJI-character data is not equal to one Chinese-style-reading character data (step S506; N), the phonetic converting unit 22 executes a phonetic conversion process (step S510).

Figure 15:
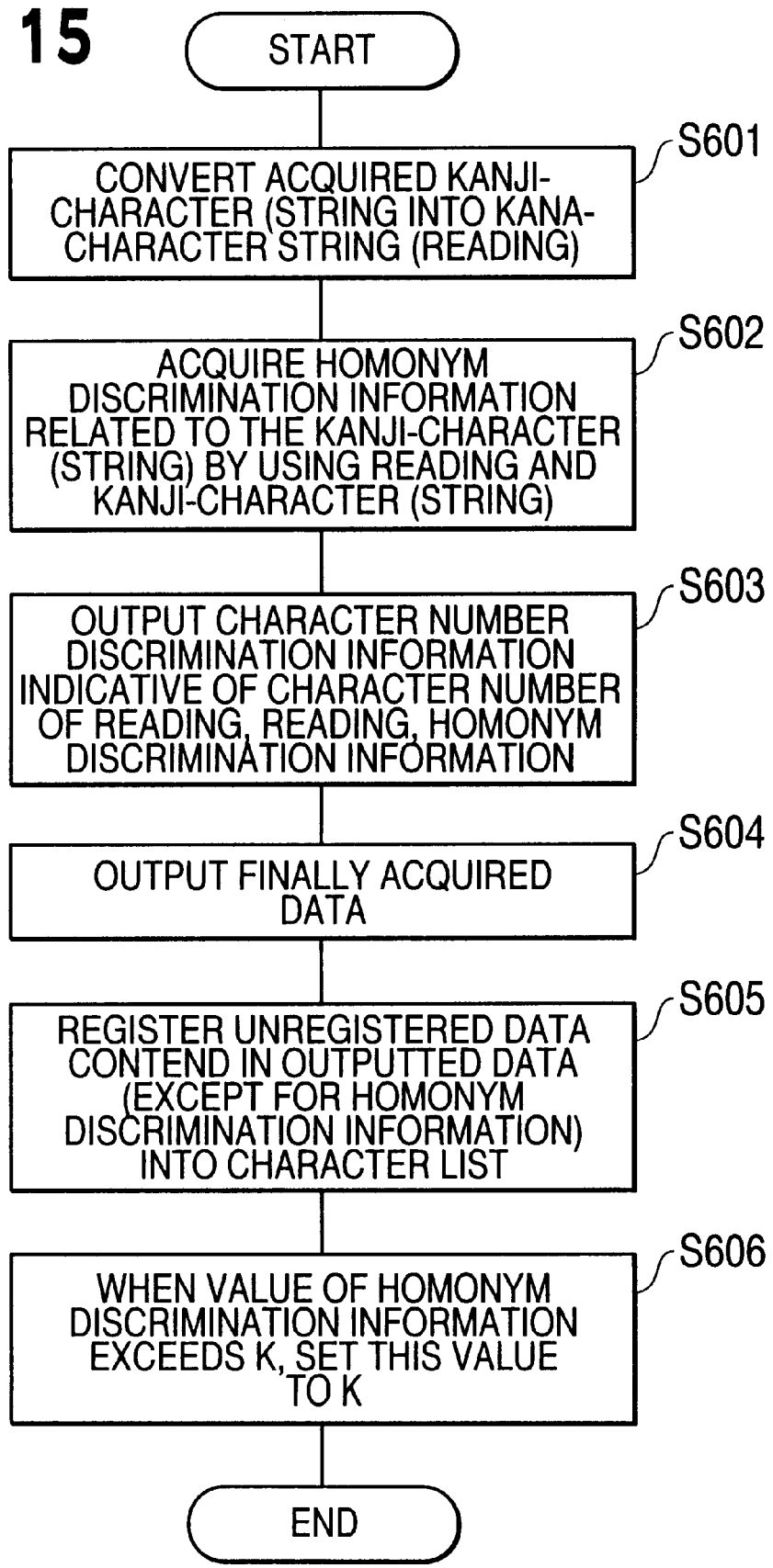
FIG. 15 is a flow chart for explaining a phonetic converting process operation executed by the phonetic converting unit employed in the data compressing/decompressing apparatus according to the third embodiment.

FIG. 15 shows a flow chart of the phonetic conversion process. As shown in this flow chart of FIG. 15, when the phonetic conversion process is performed, the phonetic converting unit 22 firstly converts either a KANJI-character string or a KANJI-character, which is indicated by the data acquired before the non-KANJI-character data into a KATAKANA-character string (reading) (step S601). Next, the phonetic converting unit 22 acquires homonym discrimination information related to the reading thereof and the KANJI-character string (KANJI-character) from the homonym dictionary 17 (step S602). Then, the phonetic converting unit 22 outputs the character number discrimination information indicative of the reading character number, the reading, and the homonym discrimination information in this order to the temporary storage unit 24 (step S603), and further outputs the finally acquired data (non-KANJI-character) to the temporary storage unit 24 (step S604).

Thereafter, in the case that the unregistered data is present in the data outputted at the steps S603 and S604 except for the homonym discrimination information, the phonetic converting unit 22 registers this (these) data into the character list (step S605). When the value of the homonym discrimination information exceeds the variable "K", this value is set to "K" (step S606), and thus the phonetic conversion process is complete (advanced to step S511 of FIG. 14).

Then, when a detection is made that "EOF" is outputted (step S511; Y), the phonetic converting unit 22 ends the process operation shown in FIG. 14.

As previously described, the phonetic converting unit 22 produces in the temporary storage unit 24 such a phonetic data having the substantially same format as the phonetic data outputted from the phonetic converting unit 12 of the first embodiment. Also, the phonetic converting unit 22 produces the character list equal to the list for the character number discrimination information, the starting position discrimination information, the 1-byte character, and the 2-byte character, which are contained in this phonetic data. Also, the phonetic converting unit 22 stores the maximum value of the homonym discrimination information contained in the phonetic data into the variable "K", and then accomplishes the process operation shown in the drawing.

When the process operation by the phonetic converting unit 22 is accomplished, the intermediate code converting unit 23 commences the operation. As previously described, the intermediate code converting unit 23 owns two operation modes. In this case, first, a description will now be made of operations in the bit length non-designation mode with reference to flow charts shown in FIG. 16 and FIG. 17.

Figure 16:
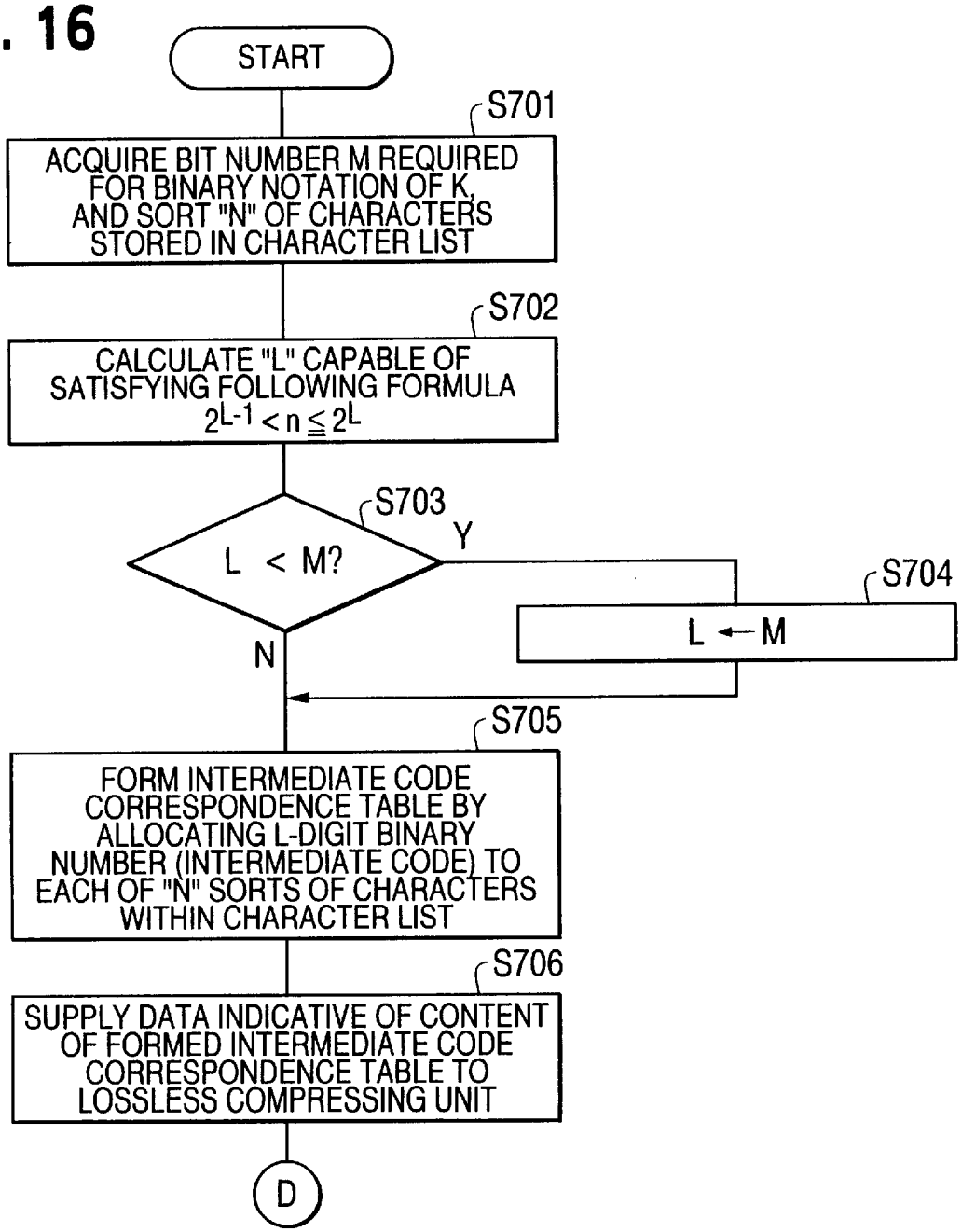
FIG. 16 is a flow chart for describing sequential operation of an intermediate code converting unit employed in the data compressing/decompressing apparatus according to the third embodiment when a bit length is not designated.
Figure 17:
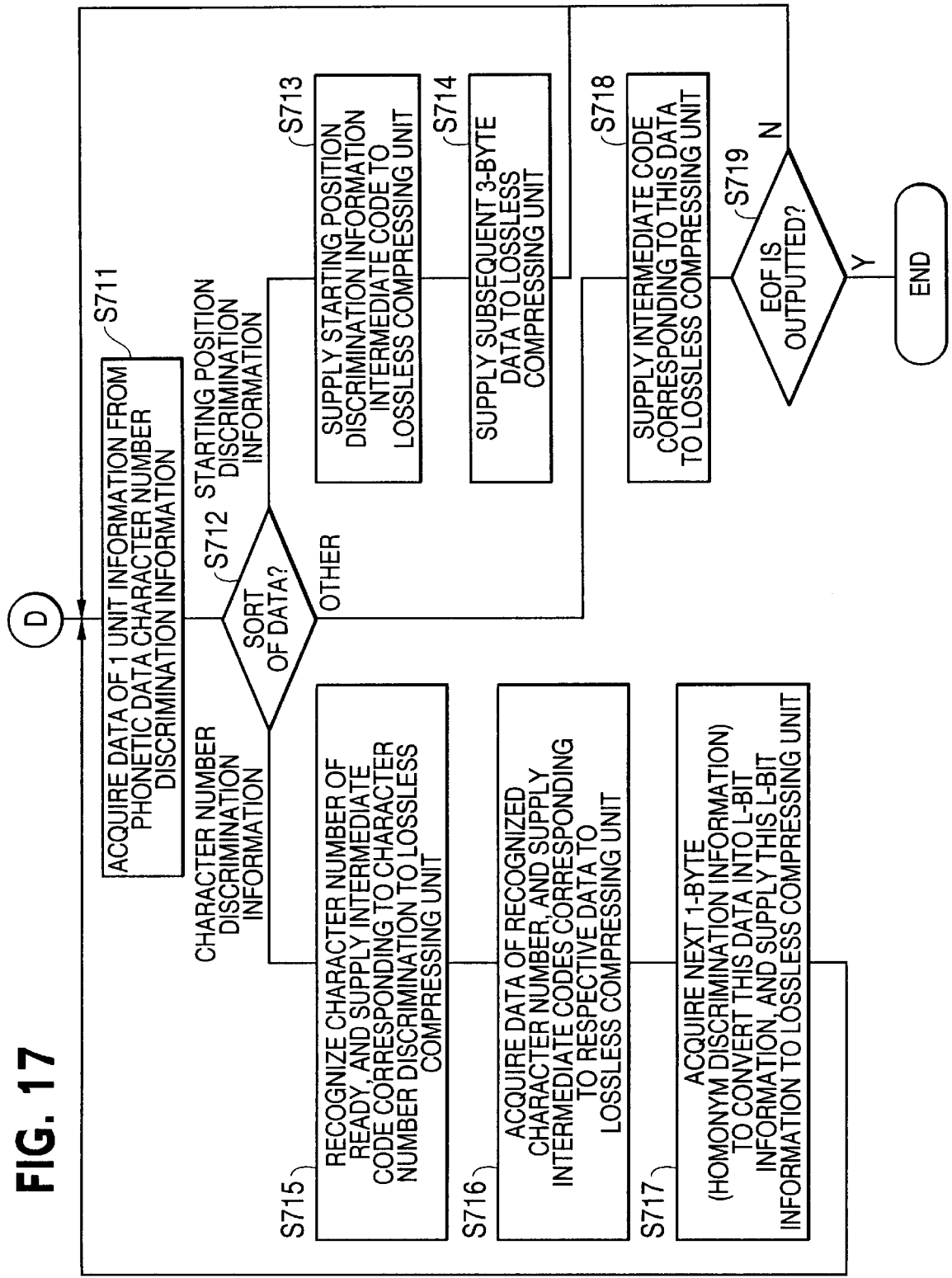
FIG. 17 is a flow chart for describing sequential operation of an intermediate code converting unit employed in the data compressing/decompressing apparatus according to the third embodiment when a bit length is not designated.

When the production of the phonetic data by the phonetic converting unit 22 is complete, as indicated in the flow chart of FIG. 16, the intermediate code converting unit 23 obtains a minimum bit number "M" required to express the value of K by the binary number, and a character sort number "n" stored in the character list (step S701). Next, the intermediate code converting unit 23 calculates "L" capable of satisfying $2^{L-1} < n \leq 2^L$ (step S702). Then, when the calculated value "L" is smaller than "M" (step S703; Y), the value of M is set to L (step S704), and the process operation is advanced to a step S705. On the other hand, when the calculated value L is not larger than M (step S703; Y), the process operation is advanced to a further step S705 without updating the value of L.

At the step S705, the intermediate code converting unit 23 allocates the binary number having L digits, namely an L-bit intermediate code to each of "n" sorts of information (character number discrimination information, 2-byte character) contained in the character list, to thereby produce an intermediate code correspondence table. Subsequently, the intermediate code converting unit 23 supplies the lossless compressing unit 25 with data indicative of the content of this formed intermediate code correspondence table (step S706).

Thereafter, the intermediate code converting unit 23 acquires data about one unit information from the phonetic data stored in the temporary storage unit 24 (step S711). That is, in such a case as the intermediate code converting unit 23 acquires 1-byte data, and this data is equal to the first byte of the 2-byte character at this step, this intermediate code converting unit 23 further acquires 1-byte data. On the other hand, when the acquired data is equal to the 1-byte character, the character number discrimination information, or the starting position discrimination information, no further data is acquired, and the process operation defined at the step S711 is accomplished.

When the data acquired at the step S711 is equal to the starting position discrimination information (step S712; starting position discrimination information), the intermediate code converting unit 23 supplies the lossless compressing unit 25 with such an intermediate code stored in the intermediate code correspondence table in correspondence with the starting position discrimination information (will be referred to as an "intermediate code for starting position discrimination information" hereinafter) (step S713). Next, 3-byte data subsequent to this starting position discrimination information among the phonetic data, namely, both data (2 bytes) indicative of Chinese-style-reading KANJI-character and the end position discrimination information (1 byte) are directly supplied to the lossless compressing unit 25 (step S714). Thereafter, the process operation by the intermediate converting unit 23 is returned to the step S711 at which the process operation for the next data contained in the phonetic data is commenced.

When the acquired data corresponds to the character number discrimination information (step S712; character number discrimination information), the intermediate code converting unit 23 recognizes the character number of the reading from this character number discrimination information, and also supplies the lossless compressing unit 25 with an intermediate code which is stored in the intermediate code correspondence table in correspondence with this character number discrimination information (step S715). Next, the data with the recognized character number is acquired, and the intermediate codes corresponding to the respective data are supplied to the lossless compressing unit 25 (step S716). Then, the intermediate code converting unit 23 acquires the next 1-byte data from the phonetic data, namely the homonym discrimination information, and then changes this homonym discrimination information into L-bit information which will be then supplied to the lossless compressing unit 25 (step S717). In other words, in the case of L>8, the intermediate code converting unit 23 supplies the lossless compressing unit 25 with such an L-bit information that "0" of "L–8" pieces is added to the upper-digit bit side of the homonym discrimination information. In the case of L<8, the intermediate code converting unit 23 supplies the lossless compressing unit 25 with such an L-bit information that "0" of "8–L" pieces is removed from the upper-digit bit side of the homonym discrimination information. Apparently, in such a case as L=8, this code converting unit 23 directly supplies the homonym discrimination information to the lossless compressing unit 25. Thereafter, the process operation by the intermediate code converting unit 23 is returned to the step S711.

In the case that the acquired data corresponds to either the 1-byte character or the 2-byte character (step S712; others), the intermediate code converting unit 23 supplies the lossless compressing unit 25 with an intermediate code corresponding to this data (step S718). Then, when the supplied data is not equal to "EOF" (step S719; N), the process operation is returned to the step S711 at which the process operation for the next data is commenced. Conversely, when the supplied data is equal to "EOF" (step S719; Y), the process operation is complete.

As previously described, in the bit length non-designation mode, the intermediate converting unit 23 obtains the 1-byte character contained in the phonetic data, the 2-byte character other than the one Chinese-style-reading KANJI-character, the character number discrimination information, and the minimum bit number "L" capable of indicating the starting position discrimination information. At this time, when the calculated "L" is smaller than the bit number "M" required for the homonym discrimination information, the value of L is updated by the value of M. Then, each of the information contained in the phonetic data except for the one Chinese-style-reading KANJI-character and the homonym discrimination information is converted into the L-bit intermediate code. Also, the representation format of the homonym discrimination information is converted into the L bits. As to one Chinese-style-reading KANJI-character, no converting operation is carried out, but the calculated L is directly used as the element of the intermediate code data.

Figure 18:
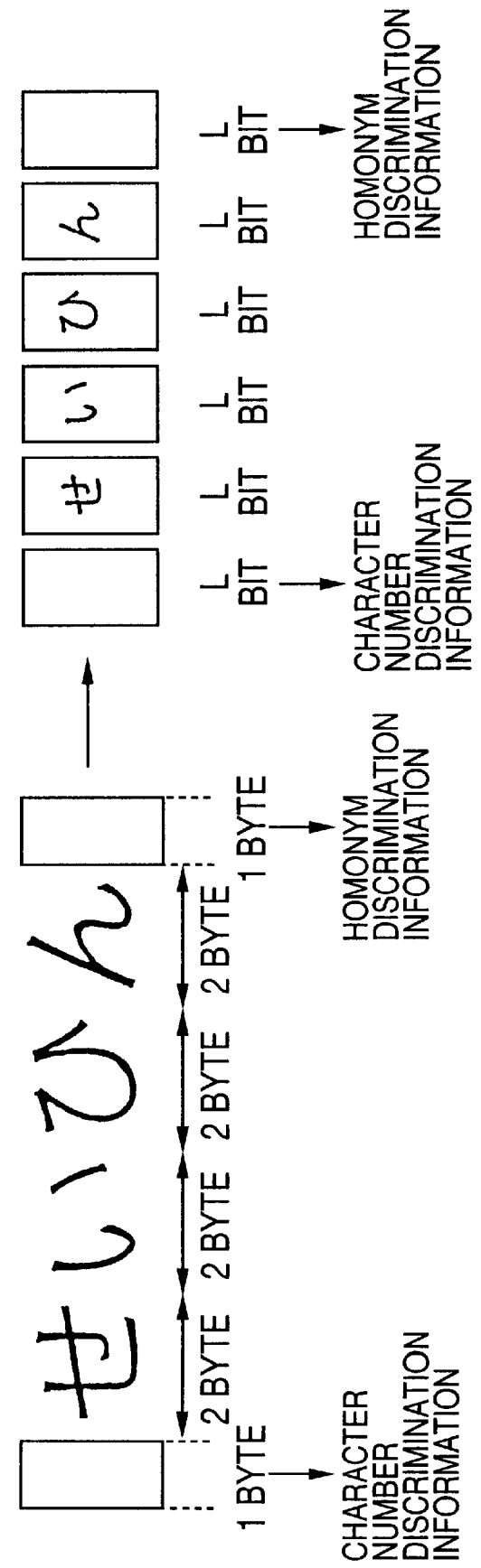
FIG. 18 is an explanatory diagram for explaining operation of the intermediate code converting unit employed in the data compressing/decompressing apparatus according to the third embodiment.

For example, in such a case as such a KANJI-character idiom of "製品", which means "product", is present in the declarative sentence data, as schematically illustrated in FIG. 18, 10-byte information is contained in the phonetic data, which is constructed of the character number discrimination information, the Chinese-style-reading of "は" which reads "seihin", and the homonym discrimination information. As shown in this drawing, the intermediate code converting unit 23 converts this information into such information made of 6 pieces of the L-bit data (namely, 5 pieces of intermediate codes and L-bit homonym discrimination information).

Also, in the case that a phrase "その間" containing a Chinese-style-reading KANJI-character of "間" is present in the declarative sentence data, as schematically illustrated in FIG. 19, such information made of the 4-byte information indicative of the "その", the starting position discrimination information, the 2-byte information indicative of "間", and the end position discrimination information. The intermediate code converting unit 23 converts this information into 3 pieces of L-bit intermediate codes, the 2-byte information indicative of "間", and the 1-byte end position discrimination information, as illustrated in FIG. 19.

Subsequently, a description will now be made of operations of the intermediate code converting unit 23 in the bit length designation mode. In this bit length designation mode, the intermediate code converting unit 23 converts the phonetic data into the intermediate code data in accordance with flow charts of FIG. 20 and FIG. 21.

Figure 20:
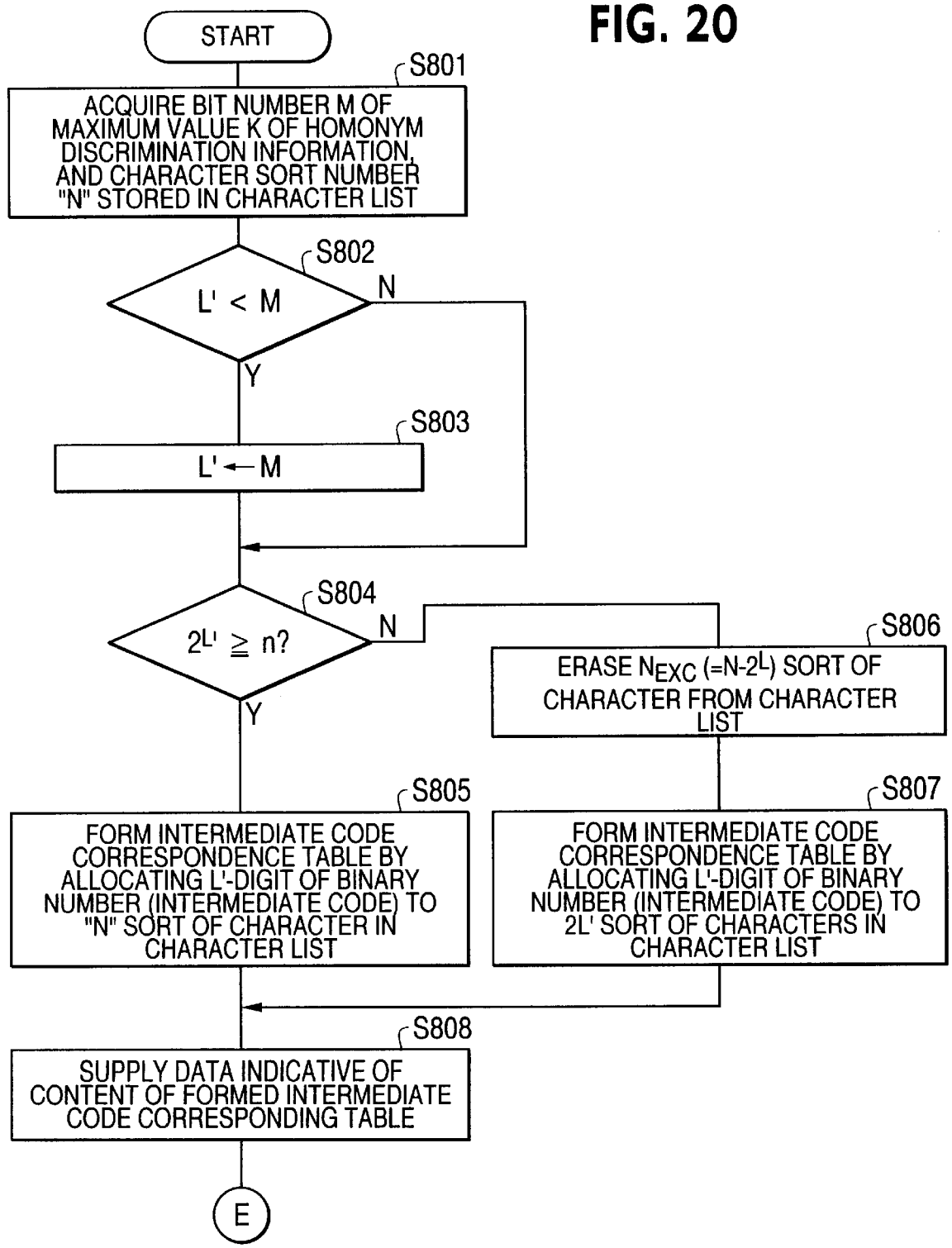
FIG. 20 is a flow chart for describing sequential operation of the intermediate code converting unit employed in the data compressing/decompressing apparatus according to the third embodiment when a bit length is designated.

As indicated in FIG. 20, the intermediate code converting unit 23 first calculates a minimum bit number "M" and a character sort number "n" in a similar manner to the bit length non-designation mode (step S801). This minimum bit number M is required to express a value of "K" equal to the maximum value of the homonym discrimination information by the binary number. The character sort number "n" is stored in the character list. Next, the intermediate code converting unit 23 judges whether or not a designated bit length L' is larger than the minimum bit number M. In the case of L'<M (step S802; Y), the intermediate code converting unit 23 sets the value of M to L' (step S803), and then the process operation thereof is advanced to a step S804. On the other hand, if not L'<M (step S802; N), then the process operation is advanced to a step S804 without updating the value of L'.

At this step S804, the intermediate code converting unit 23 judges whether or not $2^{L'} \geq n$ can be satisfied (step S804). In the case that $2^{L'} \geq n$ can be satisfied (step S804; Y), namely when all of "n" sorts of information stored in the character list can be expressed by L'-bit data, the intermediate code converting unit 23 allocates the L'-bit intermediate codes to each of the "n" sorts of information (character number discrimination information, 2-byte character, etc.) contained in the character list, so that an intermediate code correspondence table is formed (step S805).

On the other hand, when $2^{L'} \geq n$ cannot be satisfied (step S804; N), namely, when the "n" sorts of information stored in the character list cannot be expressed by the L'-bit data, the intermediate code converting unit 23 deletes $n_{exc}$ (=n– $2^{L'}$) sorts of characters from the character list (step S806). At this time, the intermediate code converting unit 23 deletes the characters (symbols) other than the HIRAGANA-characters, so that the character number discrimination information, the starting position discrimination information, and the HIRAGANA-character are left in the character list. Then, the intermediate code converting unit 23 allocates the L'-bit intermediate code to each of $2^{L'}$ sorts of information contained in the character list, so that an intermediate code correspondence table is produced (step S807).

After the intermediate code correspondence table is formed, the intermediate code converting unit 23 supplies data indicative of the content of the formed intermediate code correspondence table to the lossless compressing unit 25 (step S808). Then, in order to convert the phonetic data into the intermediate code data, a process operation shown in FIG. 21 is commenced.

Figure 21:
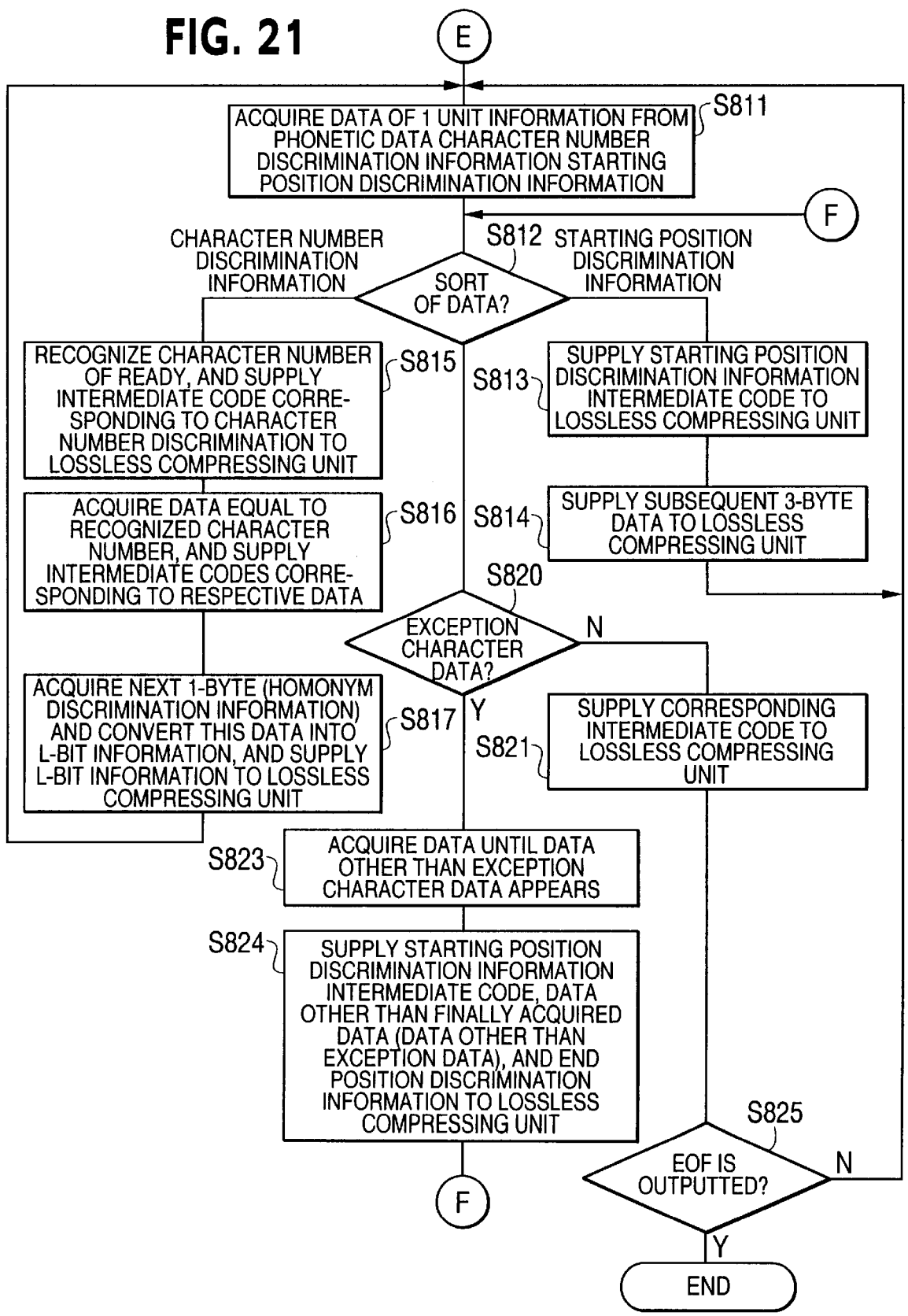
FIG. 21 is a flow chart for describing sequential operation of the intermediate code converting unit employed in the data compressing/decompressing apparatus according to the third embodiment when a bit length is designated.

At a step S811 to a step S817 shown in FIG. 21, the intermediate code converting unit 23 executes the same process operations as the steps S711 to S717 (FIG. 17), respectively. As a consequence, the operations defined at these steps are omitted.

On the other hand, in the bit length non-designation mode, the intermediate codes have been allocated to the respective 2-byte characters and the respective 1-byte characters contained in the phonetic data, other than the Chinese-style-reading 1-KANJI-character. As a consequence, when the data acquired from the phonetic data is equal to either the 1-byte character or the 2-byte character, there is the intermediate code corresponding to this data.

To the contrary, in the bit length designation mode, as to several characters contained in the phonetic data, the intermediate codes corresponding thereto are not prepared. As a result, when the process operation is branched to "others" side at the step S812, the intermediate code converting unit 23 judges whether or not the data acquired at the step S811 is equal to such data to which the intermediate code is not allocated (will be referred to as "exception character data" hereinafter) (step S820). When the acquired data is not equal to the exception character data (step S820; N), the intermediate code converting unit 23 supplies the lossless compressing unit 13 with the intermediate code corresponding to this data (step S821). Next, the intermediate code converting unit 23 judges whether or not the outputted data is equal to "EOF". If the outputted data is not equal to "EOF" (step S835; N), then the process operation is returned to the step S811 at which the process operation for the next data is commenced.

On the other hand, when the acquired data is equal to the exception character data (step S820; Y), the intermediate code converting unit 23 repeatedly acquires the data from the phonetic data until the data other than the exception character data appears (step S823). Then, the intermediate code for the starting position discrimination information, the data except for the finally acquired data (data except for exception character data), and the end position discrimination information are supplied to the lossless compressing unit 25 (step S824). Next, in order that the intermediate code converting unit 23 processes such data not equal to the finally acquired exception character data, the process operation thereof is returned to the step S812.

In other words, in the bit length designation mode, when there is a character to which the intermediate code has not been allocated in the phonetic data, the intermediate code converting unit 23 supplies the lossless compressing unit 25 with such information as the intermediate code for the starting position discrimination information, and the end position discrimination information are added before/after this character. Also, in such a case as a plurality of such characters are coupled to each other, information such that the intermediate code for the starting position discrimination information, and the end position discrimination information are added before/after this character string is supplied to the lossless compressing unit 25.

Figure 22:
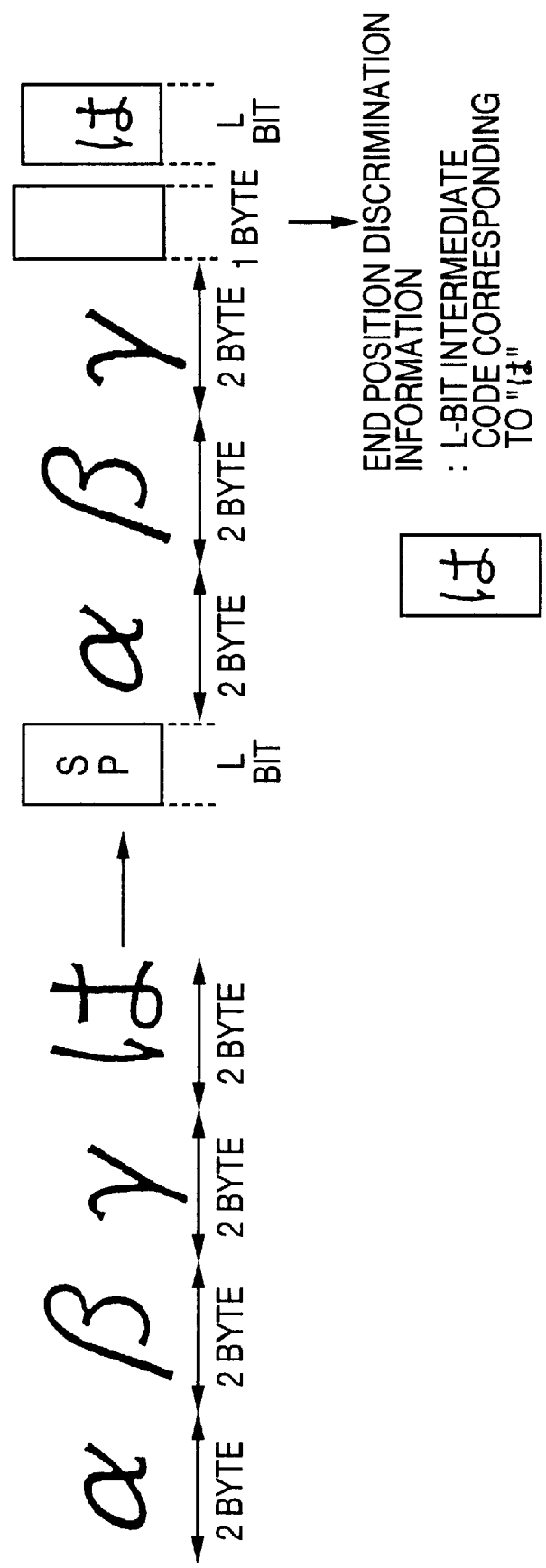
FIG. 22 is an explanatory diagram for explaining operation of the intermediate code converting unit employed in the data compressing/decompressing apparatus according to the third embodiment.

For instance, it is assumed that information indicative of such a character string as "αβγは" is present in the phonetic data, and the information related to "α", "β", "γ" is deleted from the character list at the step S806. In this case, as schematically illustrated in FIG. 22, the intermediate code converting unit 23 supplies the lossless compressing unit 25 with such information made of the intermediate code for the L(=L')-bit intermediate code for the starting position discrimination information, "αβγ", and the end position discrimination information, and also the intermediate code corresponding to "は".

In the data compressing/decompressing apparatus according to the third embodiment, both the intermediate code corresponding table produced from the phonetic data and the intermediate code data are compressed by the lossless compressing unit 25 in accordance with such a sequential operation, so that the declarative sentence data compressing operation can be complete.

Finally, data decompressing operation by the data compressing/decompressing apparatus of the third embodiment will now be described. When an instruction is issued to decompress certain compression data (compressed data), the lossless decompressing unit 26 decompresses compression data related to the intermediate code correspondence table for constituting this compression data. Subsequently, the lossless decompressing unit 26 decompresses the compression data related to the intermediate code data.

Figure 23:
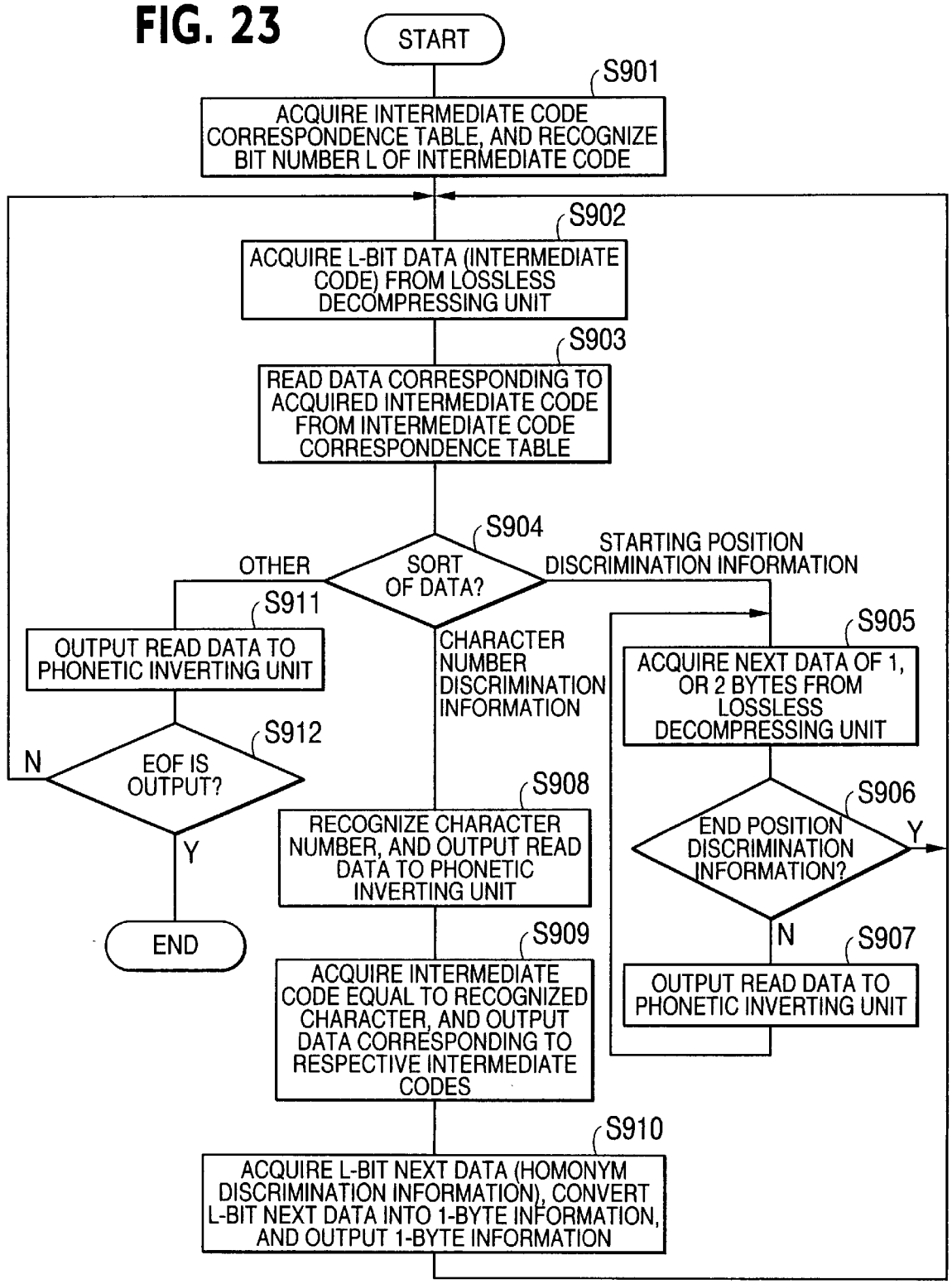
FIG. 23 is a flow chart for representing sequential operation of an intermediate code inverting unit employed in the data compressing/decompressing apparatus according to the third embodiment.
Figures 24, 25:
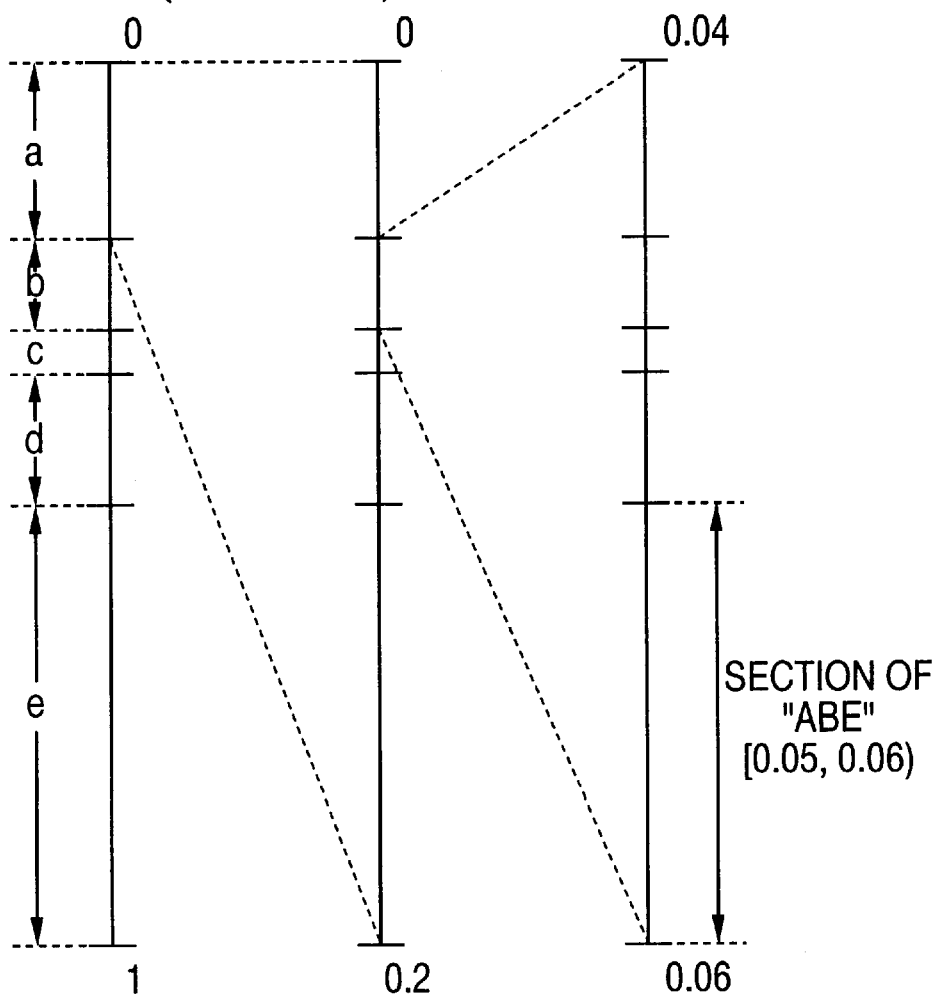
FIG. 24 represents a correspondence relationship among a character, an occurrence probability, a range in the arithmetical coding operation.
FIG. 25 is an explanatory diagram for explaining a coding sequential operation in the arithmetical coding operation.
Figure 26:
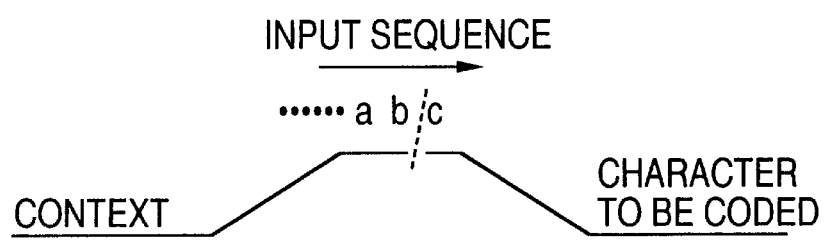
FIG. 26 is an explanatory diagram of a context.
Figure 27:
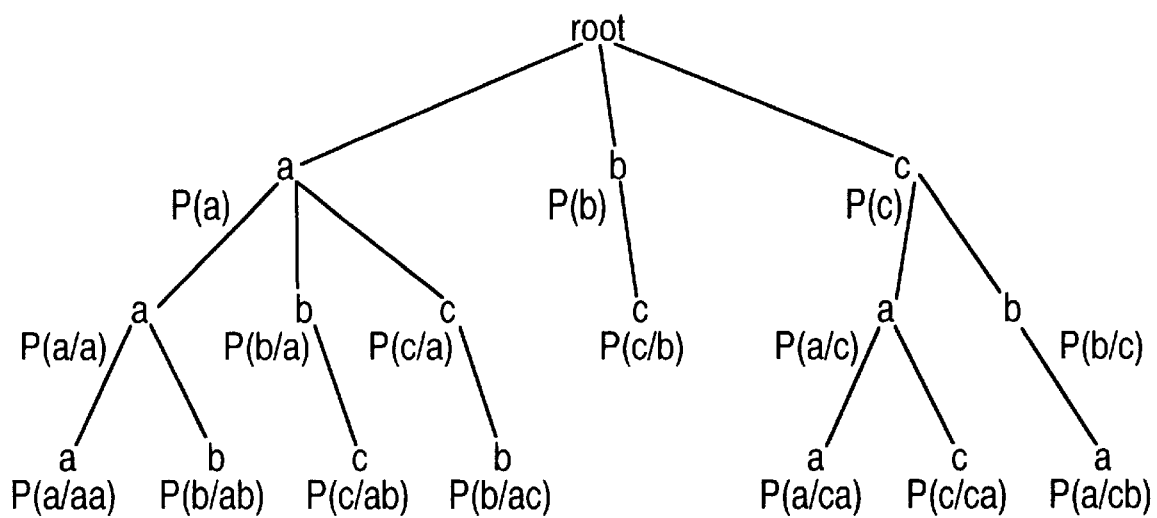
FIG. 27 schematically represents an example of a tree structure used to acquire a context.

In response to this decompression operation, the intermediate code inverting unit 27 executes a process operation defined in a flow chart of FIG. 23. That is, the intermediate code inverting unit 27 first acquires the intermediate code correspondence table from the lossless decompressing unit 26, and then recognizes the bit number "L" of the intermediate code (step S901). Subsequently, the L-bit data (intermediate code) is acquired from the lossless decompressing unit 26 (step S902). Then, information corresponding to the acquired intermediate code is read from the intermediate code corresponding table (step S903).

Thereafter, when the read information is equal to the starting position discrimination information (step S904; starting position discrimination information), the intermediate code inverting unit 27 acquires next 1-byte data, or 2-byte data from the lossless decompressing unit 26 (step S905). Then, if the acquired data is not equal to the end position discrimination information (step S906; N), the intermediate code inverting unit 27 directly outputs this data (namely, containing no end position discrimination information) to the phonetic inverting unit 28 (step S907), and the process operation thereof is returned to the step S905. On the other hand, when the acquired data is equal to the end position discrimination information (step S906; Y), the process operation of the intermediate inverting unit 27 is returned to the step S902 without outputting this data, so that this intermediate inverting unit 27 restarts the data acquisition in unit of L-bit.

When the data read from the intermediate code correspondence table is equal to the character number discrimination information (step S904; character number discrimination information), the intermediate code inverting unit 27 recognizes the quantity of succeeding characters about reading thereof, and converts the read data into 1-byte character number discrimination information which will be then outputted to the phonetic inverting unit 28 (step S908). Next, the intermediate codes equal to the number of the recognized characters are acquired from the lossless decompressing unit 26, and then data are outputted which correspond to the respective acquired intermediate codes based on the intermediate code correspondence table (step S909). Thereafter, the intermediate code inverting unit 27 acquires L-bit data, namely the homonym discrimination information, changes this homonym discrimination information into 1-byte information, and then outputs this 1-byte information to the phonetic inverting unit 28 (step S910). Then, the process operation is returned to the step S902 at which the L-bit data acquiring operation is restarted.

In the case that the data read from the intermediate code correspondence table is equal to neither the starting position discrimination information, nor the character number discrimination information (step S904; others), the intermediate code inverting unit 27 outputs this data to the phonetic inverting unit 28 (step S911). Then, when this outputted data is not equal to "EOF" (step S912; N), the process operation is returned to the step S902. Conversely, when this data is equal to "EOF" (step S912; Y), the process operation shown in FIG. 23 is ended.

As previously described, when the intermediate code for the starting position discrimination information appears, the intermediate code inverting unit 27 recognizes that the data until the end position discrimination information subsequently appears is equal to the byte-unit data (Chinese-style-reading 1-KANJI-character, or exception character data). Then, as to the data sandwiched between the intermediate code for the starting position discrimination information and the end position discrimination information, this data is directly outputted to the phonetic inverting unit 28. At this time, the intermediate code inverting unit 27 does not output the starting position discrimination information, and the end position discrimination information. Also, as to such homonym discrimination information which cannot be independently discriminated from the intermediate code, the position thereof is specified based on the position of the intermediate code for the character number discrimination information, and this information is returned to the 1-byte data.

As a consequence, such phonetic data as all of the starting position discrimination information and the end position discrimination information have been deleted from the phonetic data outputted from the phonetic converting unit 22 are supplied to the phonetic inverting unit 28. Accordingly, the phonetic inverting unit 28 is so arranged that the phonetic data may be converted into the declarative sentence data in accordance with the completely same sequence as that of the phonetic inverting unit 15 according to the first embodiment.

What is claimed is:

1. A data compressing apparatus for compressing original text data containing character information in which a single character is expressed by plural-byte information, comprising:

phonetic text data producing means for producing phonetic text data equal to the original text data such that the character information contained in the plural-byte coded original text data is replaced by phonetic character information, expressed as a phonogram in 1-byte code characters in which the number of kinds of characters is less than the number of kinds of characters in the original text data; and compressing means for compressing the phonetic text data produced by said phonetic text data producing means.

2. A data compressing apparatus for compressing original text data containing character information in which a single character is expressed by plural-byte information, comprising:

phonetic character information storing means for storing phonetic character information expressed with phonograms in 1-byte code characters in which the number of kinds of characters is less than the number of kinds of characters in the original text data and equivalent to said character information;

retrieving/reading means for retrieving the word information to be converted stored in said phonetic character information storing means from said original text data, and also for reading phonetic character information corresponding to the retrieved word information to be converted from said phonetic character information storing means;

phonetic text data producing means for producing phonetic text data by replacing the word information to be converted within said plural-byte coded original text data retrieved by said retrieving/reading means with word replacement information to be converted, which contains the phonetic character information read by said retrieving/reading means;

intermediate code table forming means for forming an intermediate code table used to adapt an intermediate code to an information element utilized in the phonetic text data produced by said phonetic text data producing means;

intermediate code text data by producing means for producing intermediate code text data by converting the respective information elements for constructing said phonetic text data into the corresponding intermediate codes by using the intermediate code table produced by said intermediate code producing means; and compressing means for compressing the intermediate code text data produced by said intermediate code text data producing means.

3. A data compressing apparatus as claimed in claim 2 wherein:

said intermediate code table forming means forms an intermediate code table for allocating an intermediate code having a minimum bit number to each of the information elements used in said phonetic text data, and said minimum bit number is capable of expressing these information elements.

4. A data compressing apparatus as claimed in claim 2 wherein:

said phonetic text data producing means produces the phonetic text data by replacing a preselected sort of character information by replacement information sandwiched between starting position discrimination information and end position discrimination information, which indicate that said character information is equal to the preselected sort of character information;

said intermediate code table forming means forms such an intermediate code table as the intermediate codes do not correspond to both information subsequent to said starting position discrimination information and said end position discrimination information within said phonetic text data; and said intermediate code data producing means does not convert both the information subsequent to said starting position discrimination information and said end position discrimination information within said phonetic text data into the intermediate codes.

5. A data compressing apparatus as claimed in claim 2 wherein:

said intermediate code table forming means selects "N-1" pieces of information elements when a sort of information elements used in said phonetic text data exceeds a number "N" of information capable of being expressed by a predetermined bit number to thereby allocate intermediate codes among the information elements used in said phonetic text data; and also form an intermediate code table by which said predetermined bit number of intermediate codes, whose contents are different from each other, are related both to said selected "N-1" pieces of information elements and to said starting position discrimination information; and said intermediate code data producing means produces the intermediate code text data in such a manner as with regard to the information contained within said phonetic text data, to which the intermediate code is related by said intermediate code table; and with regard to unallocated information where no intermediate code is allocated, said unallocated information is replaced by unallocated replacement information, said unallocated replacement information being equal to such information containing the unallocated information and having an intermediate code related to said starting position discrimination information, and also capable of recognizing an end position.

6. A data compressing apparatus as claimed in claim 2 wherein:

said phonetic character information storing means stores phonetic character information and homonym discrimination information for discriminating other words to be converted to which the same homonym discrimination character information is adapted with respect to said plurality of words to be converted;

said retrieving/reading means reads out the phonetic character information and the homonym discrimination information, which correspond to the retrieved words to be converted;

said phonetic text data producing means replaces the word information to be converted within said original text data by word replacement information to be converted which contains the phonetic character information and the homonym discrimination information read by said retrieving/reading means; and said intermediate code table forming means forms the intermediate code table directed to the information elements except for said homonym discrimination information.

7. A data compressing apparatus as claimed in claim 2 wherein:

said phonetic character information storing means stores phonetic character information and homonym discrimination information for discriminating other words to be converted to which the same homonym discrimination character information is adapted with respect to said plurality of words to be converted;

said retrieving/reading means reads out the phonetic character information and the homonym discrimination information, which correspond to the retrieved words to be converted; and said phonetic text data producing means replaces the word information to be converted within said original text data by word replacement information to be converted which contains the phonetic character information and the homonym discrimination information read by said retrieving/reading means; said word replacement information containing the homonym discrimination information at a specific position.

8. A data compressing apparatus as claimed in claim 2 wherein:

said phonetic text data producing means applies numeral value discrimination information indicative of a length of the phonetic character information read by said retrieving/reading means to a head portion of said word replacement information to be converted.

9. A data compressing apparatus as claimed in claim 2 wherein:

said phonetic text data producing means produces the phonetic text data by replacing said word information to be converted by such word replacement information to be replaced, which is sandwiched between phonetic character information starting position discrimination information and phonetic character information end position discrimination information, which indicate a start and an end of the word information to be converted.

10. A data compressing apparatus for compressing original text data containing character information in which a single character is expressed by plural-byte information, comprising:

phonetic character information storing means for storing phonetic character information expressed with phonograms in 1-byte code characters in which the number of kinds of characters is less than the number of kinds of characters in the original text data and equivalent to said character information;

retrieving/reading means for retrieving the word information to be converted stored into said phonetic character information storing means from said original text data, and also for reading phonetic character information corresponding to the retrieved word information to be converted from said phonetic character information storing means;

phonetic text data producing means for producing phonetic text data by replacing the word information to be converted within said plural-byte coded original text data retrieved by said retrieving/reading means by word replacement information to be converted, which contains the phonetic character information read by said retrieving/reading means; and compressing means for compressing the phonetic text data produced by said phonetic text data producing means.

11. A data decompressing apparatus comprising:

decompressing means for decompressing compression text data; and original text data producing means for producing original text data equal to data for constituting an original of said compression text data by converting phonetic character information, restored by said decompressing means, expressed with phonograms composed of 1-byte code characters in which the number of kinds of characters is less than the number of kinds of characters in decompressed text data, into character information corresponding thereto.

12. A data decompressing apparatus comprising:

phonetic character information storing means for storing phonetic character information equal to information expressed with phonograms in 1-byte code characters in which the number of kinds of characters is less than the number of kinds of characters in decompressed text data and equivalent to word information to be converted being constructed of one or plural character information;

decompressing means for decompressing compression text data to output intermediate code text data;

phonetic text data producing means for producing phonetic text data by replacing each of intermediate codes contained in the intermediate code text data outputted by said decompressing means by information adapted to the intermediate code in an intermediate code table related to said compression text data; and original text data producing means for producing original text data equal to an original of said compression text data such that word replacement information to be converted is retrieved which is contained in the phonetic text data produced by said phonetic text data producing means, and said retrieved word replacement information to be converted is replaced by word information to be converted which is stored in said phonetic character information storing means in correspondence with said phonetic character information contained in said word replacement information to be converted.

13. A data decompressing apparatus as claimed in claim 12 wherein:

as to information sandwiched between end position discrimination information and an intermediate code corresponding to starting position discrimination information outputted by said decompressing means, said phonetic text data producing means directly uses said information as an element of the phonetic text data without carrying out the replacement by employing said intermediate code table.

14. A data decompressing apparatus as claimed in claim 13 wherein:

said intermediate code table is a code table such that a preselected bit number of intermediate codes having contents different from each other are adapted to "N-1" pieces of information elements and the starting position discrimination information; and as to unallocated replacement information starting with the intermediate code adapted to said starting position discrimination information contained in the intermediate code text data outputted by said decompressing means, said phonetic text data producing means outputs such information that another information added in order to discriminate said intermediate code from the end position thereof is removed from this unallocated replacement information.

15. A data decompressing apparatus as claimed in claim 12 wherein:

said phonetic character information storing means stores phonetic character information and homonym discrimination information for discriminating other words to be converted to which the same homonym discrimination character information is adapted with respect to said plurality of words to be converted; and original text data producing means operated such that word replacement information to be converted is retrieved which is contained in the phonetic text data produced by said phonetic text data producing means, and said retrieved word replacement information to be converted is replaced by word information to be converted which is stored in said phonetic character information storing means in correspondence with said phonetic character information contained in said word replacement information to be converted.

16. A data decompressing apparatus as claimed in claim 12 wherein:

said phonetic character information storing means stores therein the phonetic character information and the homonym discrimination information used to discriminate the word to be converted from another word to be converted, having the same phonetic character information with respect to each of said plural word information to be converted; and original text data producing means produces original text data equal to an original of said compression text data by such that word replacement information to be converted is retrieved which is contained in the phonetic text data produced by said decompressing means, and said retrieved word replacement information to be converted is replaced by word information to be converted which is stored in said phonetic character information storing means in correspondence with said phonetic character information contained in said word replacement information to be converted.

17. A data decompressing apparatus as claimed in claim 12 wherein:

when said word replacement information to be converted is retrieved, said original text data producing means retrieves such information starting with numeral value discrimination information indicative of a length of the phonetic character information.

18. A data decompressing apparatus as claimed in claim 12 wherein:

when said word replacement information to be converted is retrieved, said original text data producing means retrieves information sandwiched between the phonetic information starting position discrimination information and the phonetic information end position information.

19. A data decompressing apparatus comprising:

phonetic character information storing means for storing phonetic character information equal to information expressed with phonograms in 1-byte code characters in which the number of kinds of characters is less than the number of kinds of characters in decompressed text data and equivalent to word information to be converted being constructed of one or plural character information;

decompressing means for decompressing means for decompressing compression text data to output phonetic text data; and original text data producing means for producing original text data equal to an original of said compression text data such that word replacement information to be converted is retrieved which is contained in the phonetic text data produced by said decompression means, and said retrieved word replacement information to be converted is replaced by word information to be converted which is stored in said phonetic character information storing means in correspondence with said phonetic character information contained in said word replacement information to be converted.

20. A data compressing method for compressing original text data containing character information in which a single character is expressed by plural-byte information, comprising:

a phonetic text data producing step for producing phonetic text data equal to such data that each of the character information contained in the plural-byte coded original text data to be compressed is replaced by phonetic character information expressed with phonograms in 1-byte code characters in which the number of kinds of characters is less than the number of kinds of characters in the original text data; and a compressing step for compressing the phonetic text data produced by said phonetic text data producing step.

21. A data compressing method form compressing original text data containing character information in which a single character is expressed by plural-byte information, comprising:

a retrieving/reading step for retrieving word information to be converted from the plural-byte coded original text data to be compressed by using a dictionary into which phonetic character information is stored, and said phonetic character information being equal to information expressed with phonograms in 1-byte code characters in which the number of kinds of characters is less than the number of kinds of characters in the original text data and equivalent to word information to be converted which is constituted by one or a plurality of character information, and also for reading phonetic character information corresponding to the retrieved word information to be converted from said dictionary;

a phonetic text data producing step for producing phonetic text data by replacing the word information to be converted within said plural-byte coded original text data retrieved by said retrieving/reading step by word replacement information to be converted, which contains the phonetic character information read by said retrieving/reading step;

an intermediate code table forming step for forming an intermediate code table used to adapt an intermediate code to each of information elements utilized in the phonetic text data produced by said phonetic text data producing step;

an intermediate code text data producing step for producing intermediate code text data by converting the respective information elements for constructing said phonetic text data into the corresponding intermediate coded by using the intermediate code table produced by said intermediate code producing step; and a compressing step for compressing the intermediate code text data produced by said intermediate code text data producing step.

22. A data compressing method as claimed in claim 21 wherein:

said intermediate code table forming step is a step for forming an intermediate code table for allocating an intermediate code having a minimum bit number to each of the information elements used in said phonetic text data, and said minimum bit number is capable of expressing these information elements.

23. A data compressing method as claimed in claim 22 wherein:

said intermediate code table forming step is such a step for selecting "N-1" pieces of information elements when a sort of information elements used in said phonetic text data exceeds a number "N" of information capable of being expressed by a predetermined bit number to thereby allocate intermediate codes among the information elements used in said phonetic text data; and also for forming an intermediate code table by which said predetermined bit number of intermediate codes, whose contents are different from each other, are related to said selected "N-1" pieces of information elements and also to said starting position discrimination information; and said intermediate code data producing means step is such a step for producing the intermediate code text data in such a manner as concerning information contained within said phonetic text data, to which the intermediate code is related by said intermediate code table; and as to unallocated information equal to such information to which no intermediate code is allocated, said unallocated information is replaced by unallocated replacement information, said unallocated replacement information being equal to such information containing the unallocated information and having an intermediate code related to said starting position discrimination information, and also capable of recognizing an end position.

24. A data compressing method as claimed in claim 21 wherein:

said retrieving/reading step is a step for reading the phonetic character information and the homonym discrimination information, which correspond to the word to be converted, from the dictionary into which the phonetic character information and the homonym discrimination information are stored with respect to each of said plural words to be converted, said homonym discrimination information being used to be discriminated from another word to be converted, having the same phonetic character information; and said phonetic text data producing step is a step for replacing the word information to be converted within said original text data by word replacement information to be converted which contains the phonetic character information and the homonym discrimination information read by said retrieving/reading step.

25. A data compressing method as claimed in claim 21 wherein:

said phonetic text data producing step applies numeral value discrimination information indicative of a length of the phonetic character information read by said retrieving/reading step to a head portion of said word replacement information to be converted.

26. A data compressing method for compressing original text data containing character information in which a single character is expressed in plural-byte information, comprising:

a retrieving/reading step for retrieving word information to be converted from the plural-byte coded original text data to be compressed by using a dictionary into which phonetic character information is stored, and said phonetic character information being equal to information expressed with phonograms in 1-byte code characters in which the number of kinds of characters is less than the number of kinds of characters in the original text data and equivalent to word information to be converted which is constituted by one or a plurality of character information; said word information being stored in said dictionary; and also for reading phonetic character information corresponding to the retrieved word information to be converted from said dictionary;

a phonetic text data producing step for producing phonetic text data by replacing the word information to be converted within said plural-byte coded original text data retrieved by said retrieving/reading step by word replacement information to be converted, which contains the phonetic character information read by said retrieving/reading step; and a compressing step for compressing the phonetic text data produced by said phonetic text data producing step.

27. A data decompressing method comprising:

a decompressing step for decompressing compression text data; and an original text data producing step for producing original text data equal to data for constituting an original of said compression text data by converting phonetic character information, restored by said decompressing step, expressed with phonograms in 1-byte code characters in which the number of kinds of characters is less than the number of kinds of characters in decompressed text data, into character information corresponding thereto.

28. A data decompressing method comprising:

a decompressing step for decompressing compression text data to output intermediate code text data;

a phonetic text data producing step for producing phonetic text data by replacing each of intermediate codes contained in the intermediate code text data outputted by said decompressing step by information adopted to an intermediate code table related to said compression text data; and an original text data producing step for producing original text data equal to an original of said compression text data such that word replacement information to be converted is retrieved which is contained in the phonetic text data produced by said phonetic text data producing step, while using a dictionary for storing phonetic character information equal to information expressed with phonograms in 1-byte code characters in which the number of kinds of characters is less than the number of kinds of characters in decompressed text data and equivalent to word information to be converted which is constituted by one or a plurality of information, and said retrieved word replacement information to be converted is replaced by word information to be converted which corresponds to said phonetic character information to be converted.

29. A data decompressing method as claimed in claim 28 wherein:

said intermediate code table is a code table such that a preselected bit number of intermediate codes having contents different from each other are adapted to "N-1" pieces of information elements and the starting position discrimination information; and as to unallocated replacement information starting with the intermediate code adapted to said starting position discrimination information contained in the intermediate code text data outputted by said decompressing step, said phonetic text data producing step outputs such information as another information added in order to discriminate said intermediate code from the end position thereof is removed from this unallocated replacement information.

30. A data decompressing method as claimed in claim 28 wherein:

said original text data producing step replaces word replacement information to be converted which contains phonetic character information and homonym discrimination information within said phonetic text data produced by said decompressing step by the corresponding word information to be converted, while using a dictionary for storing therein the phonetic character information and the homonym discrimination information used to discriminate the word to be converted from another word to be converted, having the same phonetic character information with respect to each of said plural word information to be converted.

31. A data decompressing method as claimed in claim 28 wherein:

said original text data producing step retrieves said word replacement information to be converted by retrieving information sandwiched between starting position discrimination information and end position information.

32. A data decompressing method as claimed in claim 28 wherein:

said original text data producing step retrieves said word replacement information to be converted by retrieving information sandwiched between phonetic information starting position discrimination information and phonetic information end position information.

33. A data decompressing method comprising:

a decompressing step for decompressing compression text data to output phonetic text data; and an original text data producing step for producing original text data equal to an original of said compression text data such that word replacement information to be converted is retrieved which is contained in the phonetic text data produced by said decompressing step, while using a dictionary for storing phonetic character information equal to information expressed with phonograms in 1-byte code characters in which the number of kinds of characters is less than the number of kinds of characters in decompressed text data and equivalent to word information to be converted which is constituted by one or a plurality of character information, and said retrieved word replacement information to be converted is replaced by word information to be converted which corresponds to said phonetic character information to be converted.

34. A program recording medium for recording there into a program capable of causing a computer to function as:

phonetic text data producing means for producing phonetic text data equal to such data as each of the character information contained in the plural-byte coded original text data to be compressed is replaced by phonetic character information expressed with phonograms in 1-byte code characters in which the number of kinds of characters in less than the number of kinds of characters in the original text data; and compressing means for compressing the phonetic text data produced by said phonetic text data producing means.

35. A program recording medium for recording there into a program capable of causing a computer to function as:

decompressing means for decompressing compression text data; and original text data producing means for producing original text data equal to data for constituting an original of said compression text data by converting phonetic character information as expressed with phonograms in 1-byte code characters in which the number of character is less than the number of kinds of characters in decompressed text data, as restored by said decompressing means into character information corresponding thereto in which a single character is expressed by plural-byte code character.

36. A data compressing apparatus for compressing original document data containing character information in which a single character is expressed by plural-byte code character comprising:

data converting means for converting the original document data expressed in plural-bytes code characters into document data expressed in 1-bytes code characters which designate the pronunciation of each word in the original document data; and compressing means for compressing the document data expressed in 1-bytes code characters.

* * * * *